United States Patent
Noh et al.

(10) Patent No.: US 12,529,960 B2
(45) Date of Patent: Jan. 20, 2026

(54) APPARATUS FOR TREATING SUBSTRATE INCLUDING INTERFERENCE ALLEVIATION UNIT

(71) Applicant: SEMES CO., LTD., Cheonan-si (KR)

(72) Inventors: Sang Eun Noh, Pohang-si (KR); Dae Sung Kim, Suwon-si (KR); Ho Jin Jang, Cheonan-si (KR)

(73) Assignee: Semes Co., LTD., Cheonan-si (KR)

( * ) Notice: Subject to any disclaimer, the term of this patent is extended or adjusted under 35 U.S.C. 154(b) by 736 days.

(21) Appl. No.: 17/859,900

(22) Filed: Jul. 7, 2022

(65) Prior Publication Data
US 2023/0008351 A1     Jan. 12, 2023

(30) Foreign Application Priority Data
Jul. 8, 2021    (KR) ........................ 10-2021-0089963

(51) Int. Cl.
*G03F 7/16*      (2006.01)
*G03F 7/30*      (2006.01)
*H01L 21/67*     (2006.01)

(52) U.S. Cl.
CPC ............ *G03F 7/162* (2013.01); *G03F 7/3021* (2013.01); *H01L 21/67017* (2013.01);
(Continued)

(58) Field of Classification Search
None
See application file for complete search history.

(56) References Cited

U.S. PATENT DOCUMENTS

2006/0189103 A1*   8/2006   Matsuoka ........... H01L 21/6715
                                                          438/478
2010/0040779 A1*   2/2010   Nagamine ......... H01L 21/67051
                                                           118/708

(Continued)

FOREIGN PATENT DOCUMENTS

JP       H10-137662 A    *   5/1998
JP       2017-33988 A       2/2017
(Continued)

OTHER PUBLICATIONS

Japanese Office Action dated May 16, 2023, issued in corresponding Japanese Patent Application No. 2022-108189.

(Continued)

*Primary Examiner* — Binu Thomas
(74) *Attorney, Agent, or Firm* — HARNESS, DICKEY & PIERCE, P.L.C.

(57) ABSTRACT

Provided is an apparatus for treating a substrate. The apparatus for treating the substrate includes: a first process chamber having a first treating space therein; a second process chamber having a second treating space therein; and an exhaust unit configured to exhaust atmospheres of the first treating space and the second treating space, in which the exhaust unit includes an integrated exhaust line in which a pressure reduction unit is installed, a first exhaust line configured to connect the first process chamber and a first point of the integrated exhaust line, a second exhaust line configured to connect the first process chamber and a second point of the integrated exhaust line, and an interference alleviation unit configured to alleviate exhaust interference between the first process chamber and the second process chamber.

16 Claims, 23 Drawing Sheets

(52) U.S. Cl.
CPC .... *H01L 21/67051* (2013.01); *H01L 21/6715* (2013.01); *H01L 21/6719* (2013.01); *H01L 21/67173* (2013.01); *H01L 21/67178* (2013.01)

(56) References Cited

U.S. PATENT DOCUMENTS

2017/0028450 A1\* 2/2017 Goda ................ H01L 21/67017
2020/0395229 A1\* 12/2020 Kim ................. H01L 21/67017

FOREIGN PATENT DOCUMENTS

| KR | 10-0996339 B1 | 11/2010 |
|---|---|---|
| KR | 10-1563635 | 10/2015 |
| KR | 10-2020-0143537 A | 12/2020 |
| TW | I637452 B | 10/2018 |

OTHER PUBLICATIONS

Korean Office Action dated Jan. 2, 2023 issued in corresponding Korean Appln. No. 10-2021-0089963.
Chinese Office Action dated Dec. 5, 2024 issued in corresponding Chinese Patent Appln. No. 202210806773.3.

\* cited by examiner

BACKGROUND ART

BACKGROUND ART

APPARATUS FOR TREATING SUBSTRATE INCLUDING INTERFERENCE ALLEVIATION UNIT

CROSS-REFERENCE TO RELATED APPLICATIONS

This application claims priority to and the benefit of the Korean Patent Application No. 10-2021-0089963 filed in the Korean Intellectual Property Office on Jul. 8, 2021, the entire contents of which are incorporated herein by reference.

TECHNICAL FIELD

The present invention relates to an apparatus for treating a substrate and a method for treating a substrate, and more particularly, to an apparatus for treating a substrate and a method for treating a substrate, which perform a developing process.

BACKGROUND ART

In order to manufacture a semiconductor device, various processes such as cleaning, deposition, photolithography, etching, and ion implantation are performed. Among the processes, the lithography process includes a coating process of forming a film by coating a photosensitive liquid such as a photoresist onto a surface of a substrate, an exposure process of transferring a circuit pattern onto a film formed on the substrate, and a developing process of selectively removing the film formed on the substrate in an exposure-treated region or an opposite region thereto.

The developing process includes a substrate loading step of carrying the substrate in the process chamber, a developing liquid supplying step of supplying a developing liquid onto the substrate, a puddle step of stopping the supply of the developing liquid and maintaining the developing liquid supplied onto the substrate, and a substrate unloading step of carrying out the substrate from the process chamber.

FIG. 1 is a diagram schematically illustrating a general substrate processing apparatus and FIG. 2 is a diagram schematically illustrating an internal pressure of a process chamber in an apparatus for treating a substrate. Referring to FIGS. 1 and 2, the substrate treating apparatus 8000 includes a first process chamber 8100 and a second process chamber 8200. The first process chamber 8100 includes a first treating container 8110 having a treating space, a first support unit 8120 supporting and rotating a substrate W in the treating space, and a first exhaust line 8130 exhausting an atmosphere of the treating space. The second process chamber 8200 includes a second treating container 8210 having a treating space, a second support unit 8220 supporting and rotating the substrate W in the treating space, and a second exhaust line 8230 exhausting an atmosphere of the treating space.

The first process chamber 8100 and the second process chamber 8200 are positioned adjacent to each other, and the developing process is performed in the first process chamber 8100 and the second process chamber 8200. In the first process chamber 8100, a puddle step of stopping the supply of the developing liquid, stopping the rotation of the first support unit 8120 or rotating the first support unit 8120 at a low speed, and maintaining the developing liquid on the substrate W is conducted. In the second process chamber 8200, a substrate loading step of seating the substrate W on the second support unit 8200 is conducted.

When the puddle step is conducted in the first process chamber 8100, it is important to maintain the internal pressure of the first process chamber 8100 in order to maintain the developing liquid on the substrate W. As the substrate moves in a lower direction upon loading the substrate in the second process chamber 8200, a descending pressure of an air layer of an internal space of the second process chamber 8200 is generated. As a result, an exhaust amount exhausted through the second exhaust line 8230 and a main exhaust line 8300 instantaneously increases jointly with an internal atmosphere of the second process chamber 8200. In the case of the instantaneous increase of the exhaust amount from the second process chamber, an air flow exhausted through the main exhaust line 8300 affects the internal pressure of the first process chamber 8100 positioned adjacent to the second process chamber 8200 as in point A of FIG. 2. When the puddle step is performed in the first process chamber 8100, shaking is caused in the developing liquid being maintained on the substrate W, which causes a process defect.

SUMMARY OF THE INVENTION

The present invention has been made in an effort to provide an apparatus for treating a substrate and a method for treating a substrate, which stably maintain an internal pressure of a process chamber in which a puddle step is being conducted.

The present invention has been made in an effort to provide an apparatus for treating a substrate and a method for treating a substrate, which alleviate exhaust interference from a process chamber in which a substrate loading step is being conducted to another adjacent process chamber.

The present invention has been made in an effort to provide an apparatus for treating a substrate and a method for treating a substrate, which alleviate exhaust interference from any one process chamber in which the substrate loading step is being conducted to another adjacent process chamber in which the puddle step is being conducted.

The problem to be solved by the present invention is not limited to the above-mentioned problems, and the problems not mentioned will be clearly understood by those skilled in the art from the present specification and the accompanying drawings.

An exemplary embodiment of the present invention provides an apparatus for treating a substrate. The apparatus for treating the substrate includes: a first process chamber having a first treating space therein; a second process chamber having a second treating space therein; and an exhaust unit configured to exhaust atmospheres of the first treating space and the second treating space, in which the exhaust unit includes an integrated exhaust line in which a pressure reduction unit is installed, a first exhaust line configured to connect the first process chamber and a first point of the integrated exhaust line, a second exhaust line configured to connect the first process chamber and a second point of the integrated exhaust line, and an interference alleviation unit configured to alleviate exhaust interference between the first process chamber and the second process chamber.

According to an exemplary embodiment, the interference alleviation unit may include a discharge unit positioned between the first point to which the first exhaust line is connected and the second point to which the second exhaust line is connected in the integrated exhaust line to discharge some of the air flow in the integrated exhaust line to the outside of the integrated exhaust line.

According to an exemplary embodiment, the discharge unit may be provided to discharge some of the air flow in the integrated exhaust line to an atmosphere.

According to an exemplary embodiment, the discharge unit may further include a door for opening/closing the path through which the air flow is discharged from the integrated exhaust line to the atmosphere.

According to an exemplary embodiment, each of the first process chamber and the second process chamber may be provided to perform a developing process for the substrate, the developing process may include a substrate loading step of carrying into the substrate into the first process chamber or the second process chamber, a developing liquid supplying step of supplying a developing liquid onto the substrate while rotating the substrate at a first speed, a puddle step of stopping the supply of the developing liquid onto the substrate and stopping the substrate for a predetermined time or rotating the substrate at a second speed lower than the first speed, and a substrate unloading step of carrying out the substrate from the first process chamber or the second process chamber, and the apparatus may further include a controller configured to control the door so as to open the path when the puddle step is conducted for the substrate in the first process chamber.

According to an exemplary embodiment, the substrate loading step may include a process of moving the substrate in the lower direction, and the controller may control the door to open the path when the substrate loading step is conducted in the second process chamber.

According to an exemplary embodiment, each of the first process chamber and the second process chamber may be provided to perform the developing process for the substrate, the developing process may include a substrate loading step of carrying into the substrate into the first process chamber or the second process chamber, a developing liquid supplying step of supplying a developing liquid onto the substrate while rotating the substrate at a first speed, a puddle step of stopping the supply of the developing liquid onto the substrate and stopping the substrate for a predetermined time or rotating the substrate at a second speed lower than the first speed, and a substrate unloading step of carrying out the substrate from the first process chamber or the second process chamber, and the apparatus may further include a controller configured to control the door so as to open the path when the puddle step is conducted for the substrate in the first process chamber and the substrate loading step is conducted in the second process chamber.

According to an exemplary embodiment, the exhaust unit may further include a first valve opening/closing the first exhaust line or adjusting an exhaust flow rate, and a second valve opening/closing the second exhaust line or adjusting the exhaust flow rate, and the controller may control the first valve so that an opening rate of the first valve when conducting the puddle step for the substrate in the first process chamber is smaller than the opening rate of the first valve when conducting the developing liquid supplying step.

According to an exemplary embodiment, the discharge unit may include a first discharge unit positioned adjacent to the first point of the first exhaust line, and a second discharge unit positioned adjacent to the second point of the second exhaust line.

According to an exemplary embodiment, the discharge unit may include an interface alleviation line of which one end is connected to the integrated exhaust line, and a buffer member connected to the interference alleviation line and providing a buffer space in which the air flow discharged from the integrated exhaust line through the interference alleviation line stays.

Further, another exemplary embodiment of the present invention provides an apparatus for treating a substrate. The apparatus for treating a substrate may include: a first process chamber having a first treating space; a second process chamber having a second treating space; a transfer robot configured to transfer a substrate to the first process chamber or the second process chamber; and an exhaust unit configured to exhaust atmospheres of the first treating space and the second treating space, in which the first process chamber may include a first treating container configured to provide the first treating space, a first support unit configured to support and rotate the substrate in the first treating space; and a first developing liquid supply unit configured to supply a developing liquid onto the substrate, the second process chamber may include a second treating container configured to provide the second treating space, a second support unit configured to support and rotate the substrate in the second treating space, and a second developing liquid supply unit configured to supply the developing liquid onto the substrate, the exhaust unit may include an integrated exhaust line in which a pressure reduction unit is installed, a first exhaust line connecting the first process chamber and a first point of the integrated exhaust line, a second exhaust line connecting the first process chamber and a second point of the integrated exhaust line, and an interference alleviation unit configured to alleviate exhaust interference between the first process chamber and the second process chamber by some of an air flow in the integrated exhaust line to the outside of the integrated exhaust line, and the interference alleviation unit may be positioned between the first point to which the first exhaust line is connected and the second point to which the second exhaust line is connected in the integrated exhaust line.

According to an exemplary embodiment, the interference alleviation unit may further include a door for opening/closing the path through which the air flow is discharged from the integrated exhaust line to the atmosphere.

According to an exemplary embodiment, each of the first process chamber and the second process chamber is provided to perform the developing process for the substrate, the developing process may include a substrate loading step of carrying into the substrate into the first process chamber or the second process chamber, a developing liquid supplying step of supplying a developing liquid onto the substrate while rotating the substrate at a first speed, a puddle step of stopping the supply of the developing liquid onto the substrate and stopping the substrate for a predetermined time or rotating the substrate at a second speed lower than the first speed, and a substrate unloading step of carrying out the substrate from the first process chamber or the second process chamber, and the substrate loading step may include a process of moving the substrate in the lower direction, and the apparatus may further include a controller configured to control the door so as to open the path when the puddle step is conducted for the substrate in the first process chamber and the substrate loading step is conducted in the second process chamber.

According to an exemplary embodiment, the interference alleviation unit may include an interface alleviation line of which one end is connected to the integrated exhaust line, and a buffer member connected to the interference alleviation line and providing a buffer space in which the air flow discharged from the integrated exhaust line through the interference alleviation line stays.

Further, yet another exemplary embodiment of the present invention provides a method for treating a substrate. The method for treating a substrate may include: performing a developing process for a substrate in each treating space while exhausting an atmosphere in a treating space of each of a plurality of process chambers through the same integrated exhaust line, in which the developing process may include a substrate loading step of moving the substrate in a lower direction and laying down the substrate in a support unit, a developing liquid supplying step of supplying a developing liquid onto the substrate, a puddle step of stopping the supply of the developing liquid onto the substrate and maintaining the substrate on the support unit for a predetermined time, and a substrate unloading step of moving the substrate in an upper direction and lifting the substrate from the support unit, and while the developing process is conducted, an air flow which flows toward a second process chamber which is the other one of the process chambers from a first process chamber which is one of the process chambers is made to flow to the outside of the integrated exhaust line between the first process chamber and the second process chamber adjacent to each other to alleviate a change in air flow in a treating space of the first process chamber which interferes in a pressure of the treating space of the second process chamber.

According to an exemplary embodiment, some of the air flow in the integrated exhaust line may be emitted onto an atmosphere between the first process chamber and the second process chamber.

According to an exemplary embodiment, some of the air flow in the integrated exhaust line may be emitted onto a buffer member connected to the integrated exhaust line between the first process chamber and the second process chamber.

According to an exemplary embodiment, a door for opening/closing an opening for emitting the air flow in the integrated exhaust line to the atmosphere may be provided between a first point where the integrated exhaust line and the second process chamber are connected and a second point where the integrated exhaust line and the second process chamber are connected, and when the puddle step is conducted in the first process chamber, the opening may be opened.

According to an exemplary embodiment, door for opening/closing an opening for emitting the air flow in the integrated exhaust line to the atmosphere may be provided between a first point where the integrated exhaust line and the second process chamber are connected and a second point where the integrated exhaust line and the second process chamber are connected, and when the substrate loading step is conducted in the second process chamber, the opening may be opened.

According to an exemplary embodiment, door for opening/closing an opening for emitting the air flow in the integrated exhaust line to the atmosphere may be provided between a first point where the integrated exhaust line and the second process chamber are connected and a second point where the integrated exhaust line and the second process chamber are connected, and when the puddle step is conducted in the first process chamber and the substrate loading step is conducted in the second process chamber, the opening may be opened.

According to an exemplary embodiment of the present invention, when the developing process is conducted, the internal pressure of the process chamber in which the puddle step is conducted can be maintained.

Furthermore, according to an exemplary embodiment of the present invention, when the developing process is conducted, the exhaust interference can be alleviated from the process chamber in which the substrate loading step is conducted to another adjacent process chamber.

Furthermore, according to an exemplary embodiment of the present invention, when the developing process is conducted, the exhaust interference can be alleviated from any one process chamber in which the substrate loading step is being conducted to another adjacent process chamber in which the puddle step is being conducted.

According to the present invention, when the puddle step is conducted in any one process chamber, the exhausted air flow discharged from the process chamber in which the puddle step is being conducted and other adjacent process chambers is discharged to the outside to maintain the internal pressure of the process chamber in which the puddle step is being conducted.

The effect of the present invention is not limited to the foregoing effects, and non-mentioned effects will be clearly understood by those skilled in the art from the present specification and the accompanying drawings.

DETAILED DESCRIPTION

Figure 1:
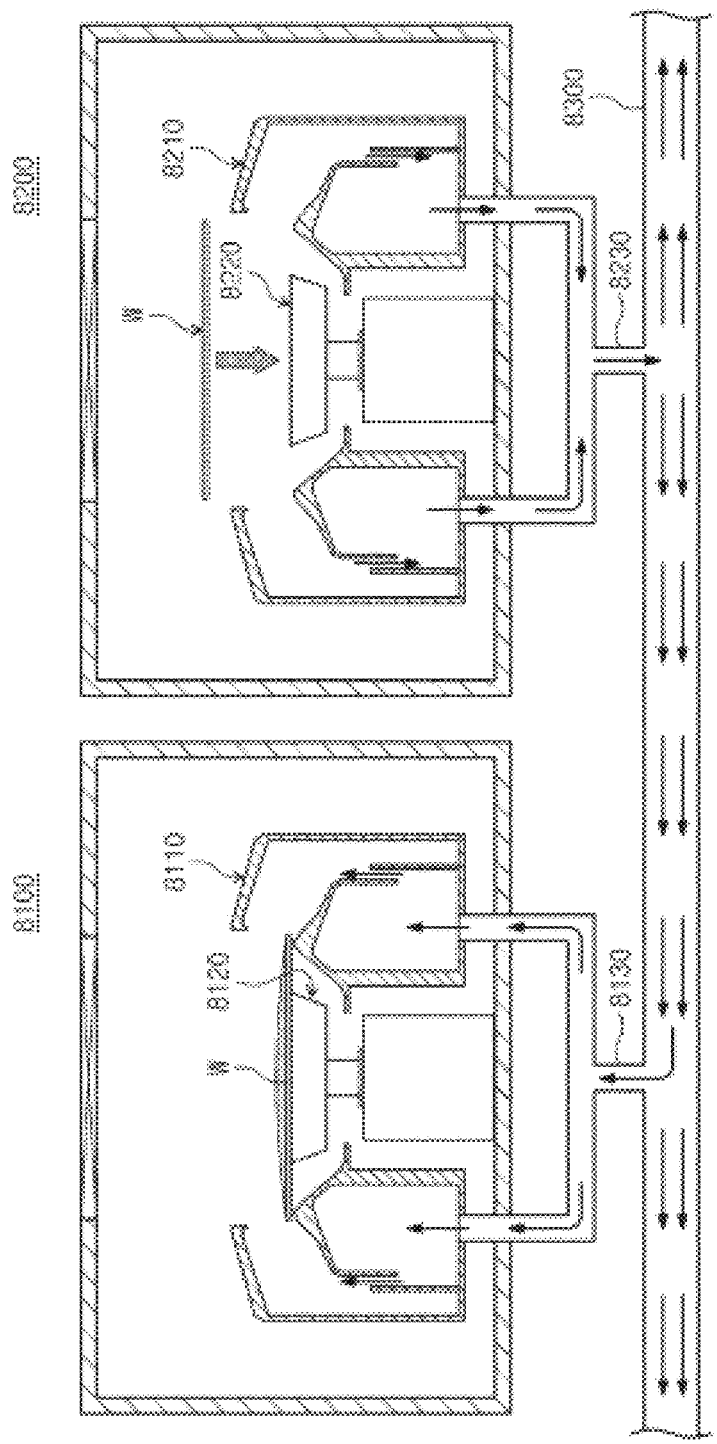
FIG. 1 is a cross-sectional view schematically illustrating a process chamber of a general substrate treating apparatus.
Figure 2:
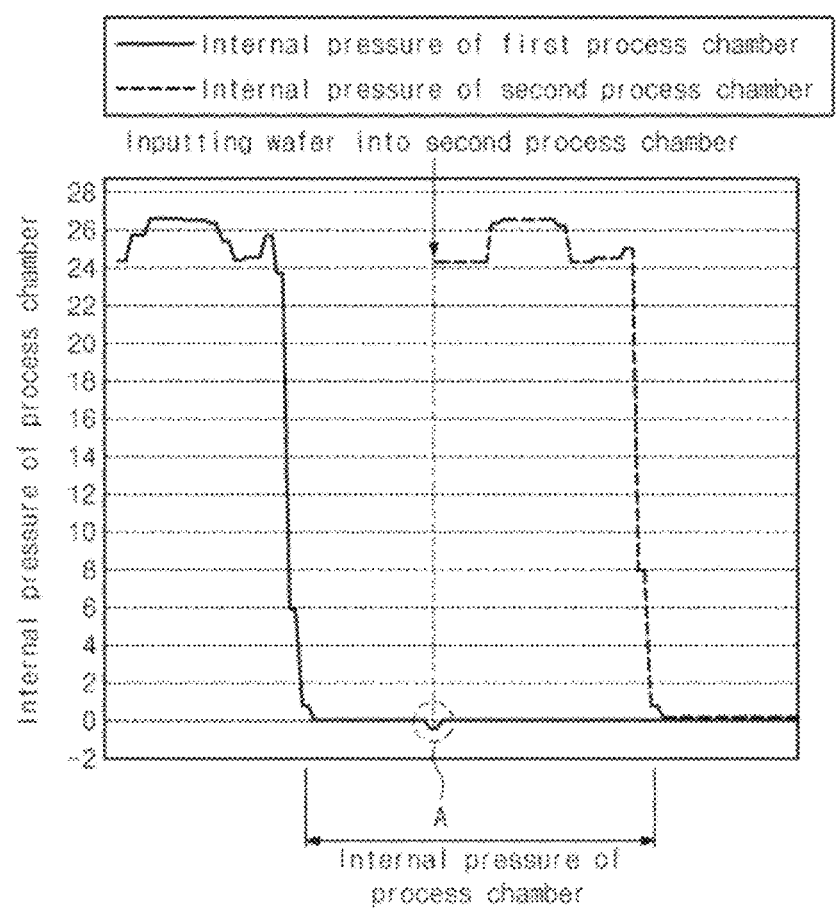
FIG. 2 is a diagram schematically illustrating an internal pressure of the process chamber in FIG. 1.

Hereinafter, an exemplary embodiment of the present invention will be described in more detail with reference to the accompanying drawings. The exemplary embodiment of the present invention can be modified in various forms, and it should not be construed that the scope of the present invention is limited to exemplary embodiments described below. The exemplary embodiment will be provided for more completely describing the present invention to those skilled in the art. Accordingly, a shape of a component in the drawing is exaggerated in order to emphasizing more clear description.

Hereinafter, an example of the present invention will be described in detail with reference to FIGS. 3 to 20.

Figure 3:
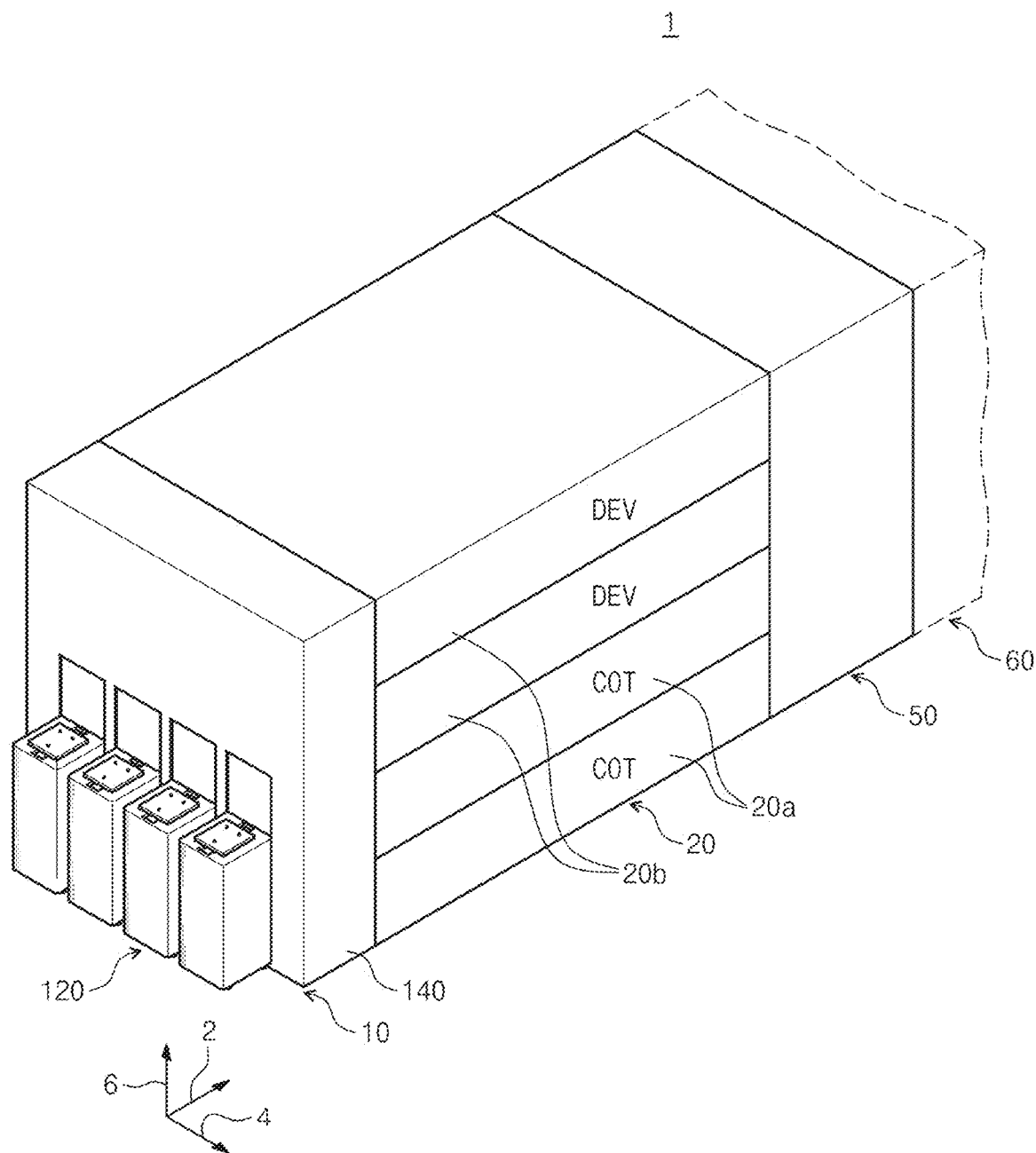
FIG. 3 is a perspective view schematically illustrating an apparatus for treating a substrate according to an exemplary embodiment of the present invention.
Figure 4:
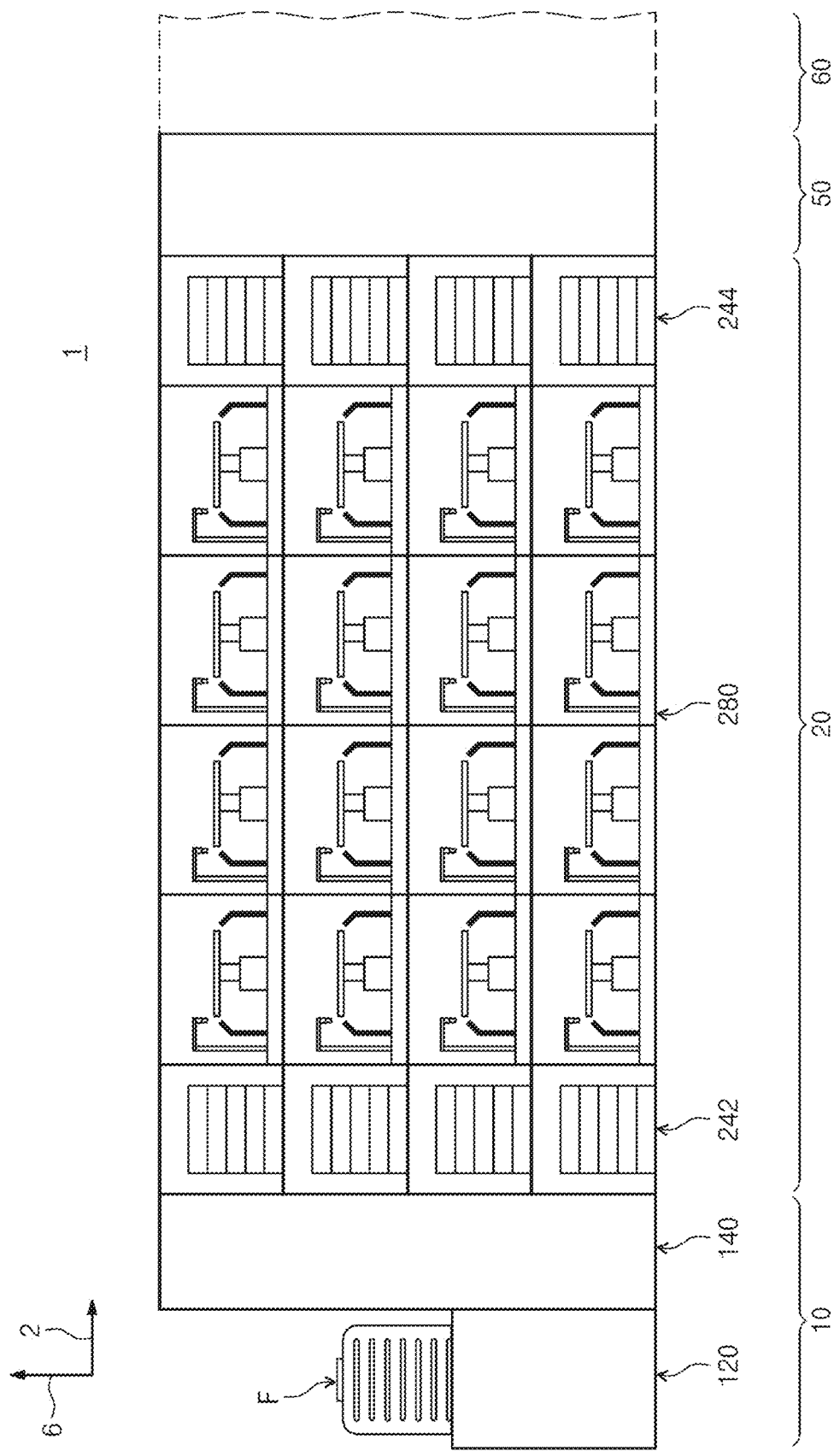
FIG. 4 is a front view of the apparatus for treating a substrate showing a coating block or a developing block in FIG. 2.
Figure 5:
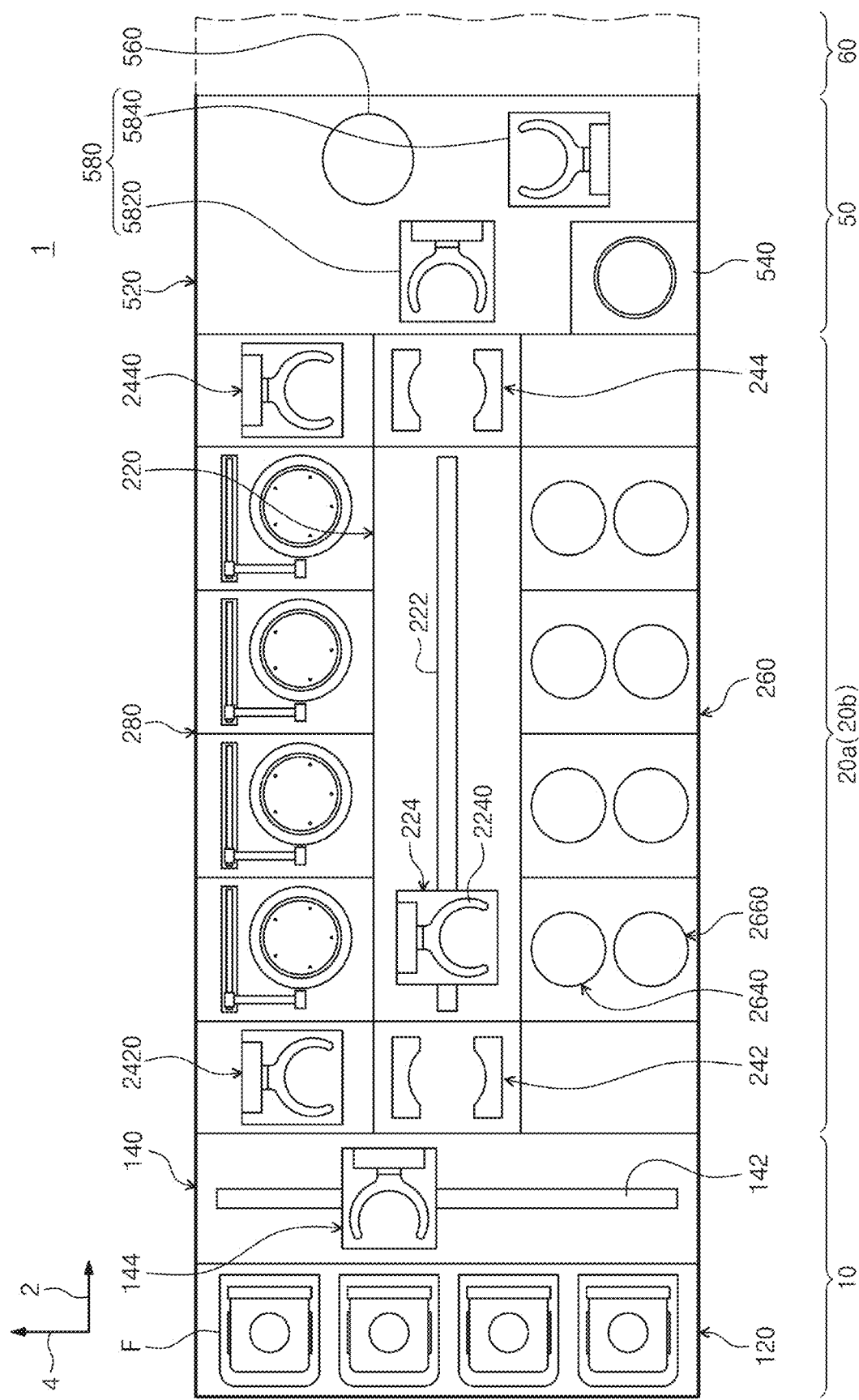
FIG. 5 is a plan view of the apparatus for treating a substrate in FIG. 2.

FIG. 3 is a perspective view schematically illustrating an apparatus for treating a substrate according to an exemplary embodiment of the present invention and FIG. 4 is a front view of the apparatus for treating a substrate in FIG. 3. FIG. 5 is a plan view of the apparatus for treating a substrate in FIG. 3.

Referring to FIGS. 3 to 5, the substrate treating apparatus 1 includes an index module 10, a treating module 20, and an interface module 50. According to an exemplary embodiment, the index module 10, the treating module 20, and the interface module 50 are sequentially arranged in line. Hereinafter, a direction in which the index module 10, the treating module 20, and the interface module 50 are arranged will be defined as a first direction 2, a direction vertical to the first direction when viewed from the top will be defined as a second direction 4, and a direction vertical to a plane, which includes both the first direction 2 and the second direction 4 will be defined as a third direction 6.

The index module 10 transfers the substrate W to the treating module 20 treating the substrate W from a container F storing the substrate W. The index module 10 stores the substrate W of which treating is completed in the treating module 20 in the container F. A longitudinal direction of the index module 10 is provided as the second direction 4. The index module 10 has a load port 120 and an index frame 140.

The container F storing the substrate W is seated on the load port 120. The load port 120 is positioned at an opposite side to the treating module 20 based on the index frame 140. A plurality of load ports 120 may be provided, and the plurality of load ports 120 may be arranged in line in the second direction 4. The number of load ports 120 may increase or decrease according to process efficiency and a footprint condition of the treating module 20.

Multiple slots (not illustrated) for storing the substrates W which are horizontally arranged to a ground surface are formed in the container F. A sealing container such as a front opening unified pod (FOUP) may be used as the container F. The container F may be placed on the load port 120 by a transportation means (not illustrated) or a worker such as overhead transfer, overhead conveyor, or an automatic guided vehicle.

An index rail 142 and an index robot 144 are provided inside the index frame 140. The index rail 142 is provided in the second direction 4 which is the longitudinal direction in the index frame 140. The index robot 144 may transfer the substrate W. The index robot 144 may transfer the substrate W between the index module 10 and a buffer chamber 240 to be described below. The index robot 144 may include an index hand 1440. The substrate W may be placed on the index hand 1440. The index hand 1440 may include an index base 1442 having an annular ring shape in which a part of a circumference is bent to be symmetric and an index support unit 1444 moving the index base 1442. A configuration of the index hand 1440 is the same as to similar to the configuration of a transfer hand 2240 to be described below. The index hand 1440 may be provided to be movable in the second direction 4 on the index rail 142. Therefore, the index hand 1440 is movable forward and backward along the index rail 142. Further, the index hand 1440 may be provided to be rotatable with the third direction 6 as an axis and movable in the third direction 6.

The treating module 20 performs the coating process and the developing process for the substrate W by receiving the substrate W stored in the container F. The treating module 20 has a coating block 20a and a developing block 20b. The coating block 20a performs a coating process for the substrate W. The developing block 20b performs a developing process for the substrate W. A plurality of coating blocks 20a is provided and the coating blocks 20a are provided to be laminated on each other. A plurality of developing blocks 20b is provided and the developing blocks 20b are provided to be laminated on each other. According to the exemplary embodiment of FIG. 3, two coating blocks 20a are provided and the developing blocks 20b are provided. The coating blocks 20a may be arranged below the developing blocks 20b. According to an example, two coating blocks 20a may perform the same process and may be provided in the same structure. Further, two coating blocks 20b may perform the same process and may be provided in the same structure.

Referring to FIG. 5, the coating block 20a includes a transfer chamber 220, a buffer chamber 230, a heat treating chamber 260, and a process chamber 280 performing liquid treating.

The developing block 20b includes a transfer chamber 220, a buffer chamber 230, a heat treating chamber 260, and a process chamber 280 performing liquid treating. The transfer chamber 220 provides a space for transferring the substrate W between the buffer chamber 240 and the heat treating chamber 260, between the buffer chamber 240 and the process chamber 280, and between the heat treating chamber 260 and the process chamber 280. The buffer chamber 240 provides a space in which the substrate W carried into the developing block 20b and the substrate W carried out from the developing block 20b temporarily stay. The heat treating chamber 260 performs the heat treating process for the substrate W. The heat treating process may include a cooling process and a heating process. The process chamber 280 performs a developing process that develops the substrate W by supplying the developing liquid onto the substrate W.

The transfer chamber 220, the buffer chamber 230, the heat treating chamber 260, and the process chamber 280 of the coating block 20a are provided in a substantially similar structure and layout to the transfer chamber 220, the buffer chamber 230, the heat treating chamber 260, and the process chamber 280 of the developing block 20ba. However, the process chamber 280 performing the liquid treating of the coating block 20a forms a liquid film by supplying the liquid onto the substrate W. The liquid film may be a photoresist film or an anti-reflective film. Since the coating block 20a is provided in the substantially similar structure and layout to the developing block 20b, a description thereof is omitted. Hereinafter, the developing block 20b will be described.

The longitudinal direction of the transfer chamber 220 may be provided as the first direction 2. A guide rail 222 and a transfer robot 224 are provided to the transfer chamber 220. The longitudinal direction of the guide rail 222 may be provided in the transfer chamber 220 in the first direction 2 as the longitudinal direction. The transfer robot 224 may be provided to be movable linearly in the first direction 2 on the guide rail 222. The transfer robot 224 transfers the substrate W between the buffer chamber 240 and the heat treating chamber 260, between the buffer chamber 240 and the process chamber 280, and between the heat treating chamber 260 and the process chamber 280.

According to an example, the transfer robot 224 has the transfer hand 2240 on which the substrate W is placed. The transfer hand 2240 may be provided to be movable forward and backward, rotatable with the third direction 6 as the axis and movable in the third direction 6.

Figure 6:
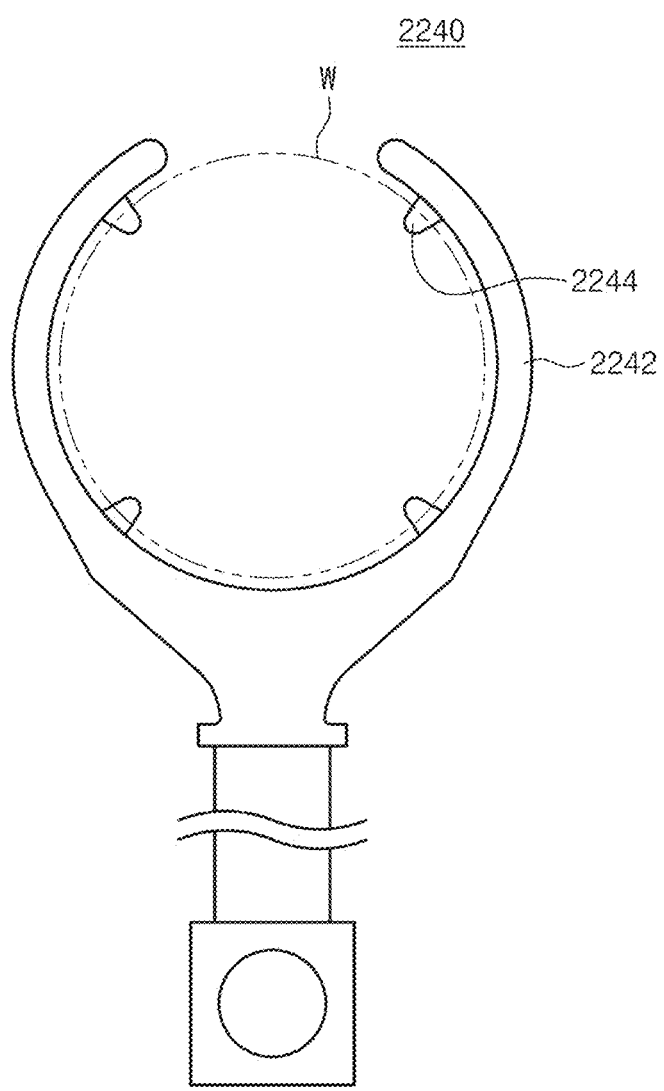
FIG. 6 is a diagram illustrating an example of a hand provided to a transfer chamber in FIG. 5.

FIG. 6 is a view illustrating an example of a transfer hand provided to a transfer chamber in FIG. 5. Referring to FIG. 6, the transfer hand 2240 includes a base 2242 and a support protrusion 2244. The base 2242 may have the annular ring shape in which a part of the circumference is bent. The base 2242 may have a ring shape in which a part of the circumference is bent to be symmetric. The base 2242 has an inner diameter larger than a diameter of the substrate W. The support protrusion 2244 extends inward from the base 2242. A plurality of support protrusion 2244 is provided, and supports an edge region of the substrate W. According to an example, four support protrusions 2244 may be provided at an equal interval.

Referring back to FIGS. 4 and 5, a plurality of buffer chambers 240 is provided. Some of the buffer chambers 240 are arranged between the index module 10 and the transfer chamber 220. Hereinafter, the buffer chamber will be defined as a front buffer 242. A plurality of front buffers 242 is provided and arranged to be laminated on each other in an up and down direction. Other some of the buffer chambers 240 are arranged between the transfer chamber 220 and the interface module 50. Hereinafter, the buffer chamber will be defined as a rear buffer 244. A plurality of rear buffers 244 is provided and arranged to be laminated on each other in the up and down direction. Each of the front buffers 242 and the rear buffers 244 temporarily keeps a plurality of substrates W. The substrate W stored in the front buffer 242 is loaded or unloaded by the index robot 144 and the transfer robot 224. The substrate W stored in the rear buffer 244 is loaded or unloaded by the transfer robot 224 and a first robot 5820 to be described below.

The buffer robots 2420 and 2440 may be provided at one side of the buffer chamber 240. The buffer robots 2420 and 2440 may include a front buffer robot 2420 and a rear buffer robot 2440. The front buffer robot 2420 may be provided at one side of the front buffer 242. The rear buffer robot 2440 may be provided at one side of the rear buffer 244. The buffer robots 2420 and 2440 are not limited thereto, and may be provided at both sides of the buffer chamber 240.

The front buffer robot 2420 may transfer the substrate W between the front buffers 242. The front buffer robot 2420 may include a front buffer hand 2422. The front buffer hand 2422 may move in the up and down direction in the third direction 6. The front buffer hand 2422 may be rotated. The front buffer hand 2422 may transfer the substrate W. The front buffer hand 2422 may load or unload the substrate W on or from pins 2486 provided on a support plate 2482 to be described below. The rear buffer robot 2440 may transfer the substrate W between the rear buffers 244. The rear buffer robot 2440 may include a rear buffer hand 2442. The configuration of the rear buffer hand 2442 is the same as or similar to the configuration of the front buffer hand 2422. Accordingly, a description of the rear buffer hand 2422 is omitted.

Figure 7:
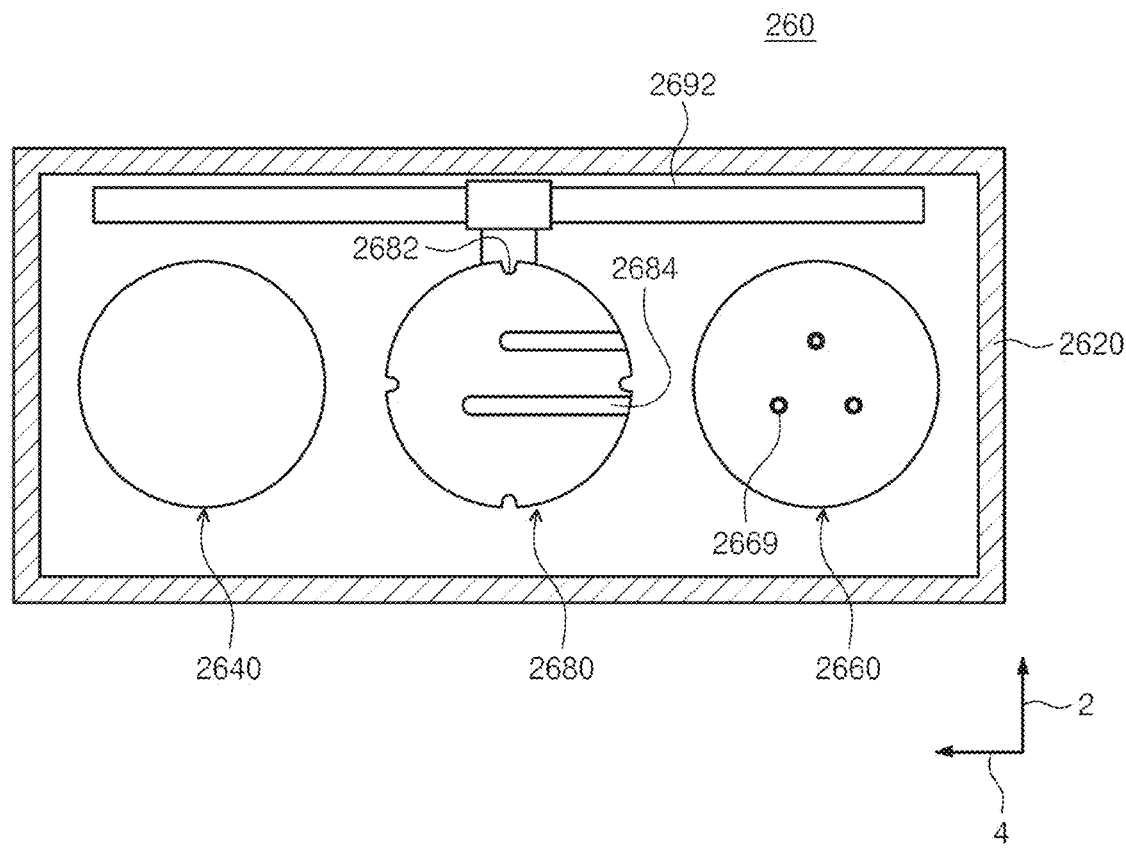
FIG. 7 is a plan view schematically illustrating an example of a heat treating chamber in FIG. 5.
Figure 8:
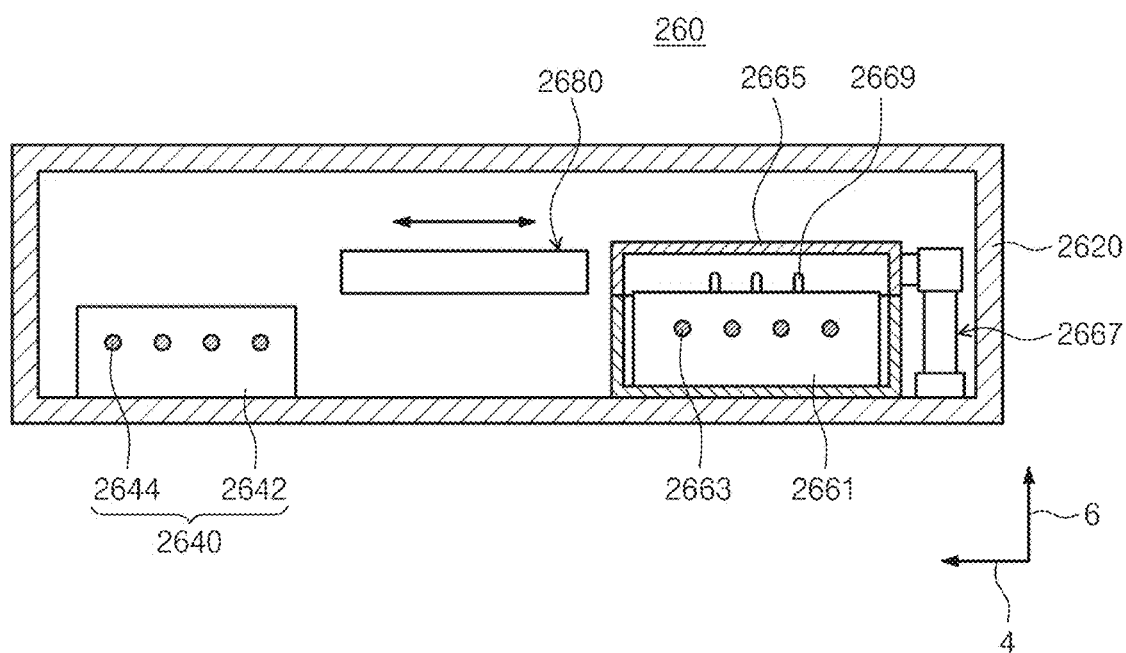
FIG. 8 is a front view of the heat treating chamber in FIG. 7.

FIG. 7 is a plan view schematically illustrating an example of a heat treating chamber in FIG. 5 and FIG. 8 is a front view of the heat treating chamber in FIG. 7. Referring to FIGS. 7 and 8, a plurality of heat treating chambers 260 is provided. The heat treating chambers 260 are arranged in the first direction 2. The heat treating chambers 260 are positioned at one side of the transfer chamber 220. The heat treating chamber 260 includes a housing 2620, a cooling unit 2640, a heating unit 2660, and a transfer plate 2680.

The housing 2620 is provided in a substantially rectangular parallelepiped shape. The housing 2620 provides the space therein. An entrance (not illustrated) through which the substrate W enters and exits is formed on a side wall of the housing 2620. The entrance may be maintained in an opened state. A door (not illustrated) may be provided to selectively open/close the entrance. The cooling unit 2640, the heating unit 2660, and the transfer plate 2680 are provided in the internal space of the housing 2620. The cooling unit 2640 and the heating unit 2660 are provided in line in the second direction 4. According to an example, the cooling unit 2640 may be positioned relatively closer to the transfer chamber 220 than the heating unit 2660. The cooling unit 2640 includes a cooling plate 2642. The cooling plate 2642 may have a substantially circular shape when viewed from the top. A cooling member 2644 is provided in the cooling plate 2642. According to an example, the cooling member 2644 may be formed inside the cooling plate 2642 and provided as a path in which a cooling fluid flows.

The heating unit 2660 includes a heating plate 2661, a heater 2663, a cover 2665, and a driver 2667. The heating plate 2661 may have the substantially circular shape when viewed from the top. The heating plate 2661 has a larger diameter than the substrate W. The heater 2662 is installed in the heating plate 2663. The heater 2663 may be provided as a heating resistor to which current is applied. Lift pins 2669 are provided on the heating plate 2661, which are drivable in the up and down direction in the third direction 6. The lift pin 2669 carries in the substrate W from a transportation means outside the heating unit 2660 and lays down the substrate W onto the heating plate 2661 or lifts the substrate W from the heating plate 2661 and takes over the substrate W to the transportation means outside the heating unit 2660. According to an example, three lift pins 2669 may be provided. The cover 2665 has a space of which lower portion is opened therein. The cover 2665 is positioned at an upper portion of the heating plate 2661 and moved in the up and down direction by the driver 2667. A space formed by the cover 2665 and the heating plate 2665 by moving the cover 2666 is provided as a heating space heating the substrate W.

The transfer plate 2680 is provided in a substantially disk shape, and has a diameter corresponding to the substrate W. A notch 2682 is formed at an edge of the transfer plate 2680. The notch 2682 is provided as a number corresponding to the support protrusion 2244 formed in the transfer hand 2240 of the transfer robot 224 and formed at a location corresponding to the support protrusion 2244. When upper and lower locations of the transfer hand 2240 and the transfer plate 2680 are changed at locations at which the transfer hand 2240 and the transfer plate 2680 are aligned in the up and down direction, the substrate W is transferred between the transfer hand 2240 and the transfer plate 2680. The transfer plate 2680 may be mounted on a guide rail 2692 and moved between a first region 2696 and a second region 2698 along the guide rail 2692 by the driver 2694.

A plurality of slit-shaped guide grooves 2684 is provided in the transfer plate 2680. The guide groove 2684 extends from an end of the transfer plate 2680 to an inside of the transfer plate 2680. A longitudinal direction of the guide groove 2684 is provided along the second direction 4, and the guide grooves 2684 are positioned spaced apart from each other in the first direction 2. The guide groove 2684 prevents the transfer plate 2680 and the lift pin 269 from interfering with each other when the substrate W is carried in and over between the transfer plate 2680 and the heating unit 2660.

The substrate W is cooled while the transfer plate 2680 on which the substrate W is placed is in contact with the cooling plate 2642. The transfer plate 2680 is provided as a material having a high thermal conductivity so as to excellently transmit the heat between the cooling plate 2642 and the substrate W. According to an example, the transfer plate 2680 may be provided as a metallic material.

Referring back to FIGS. 4 and 5, a plurality of liquid treating chambers 280 is provided. Some of the process chambers 280 may be provided to be laminated on each other. The process chambers 280 are arranged at one side of the transfer chamber 220. The process chambers 280 are arranged in line in the first direction 2.

Figure 9:
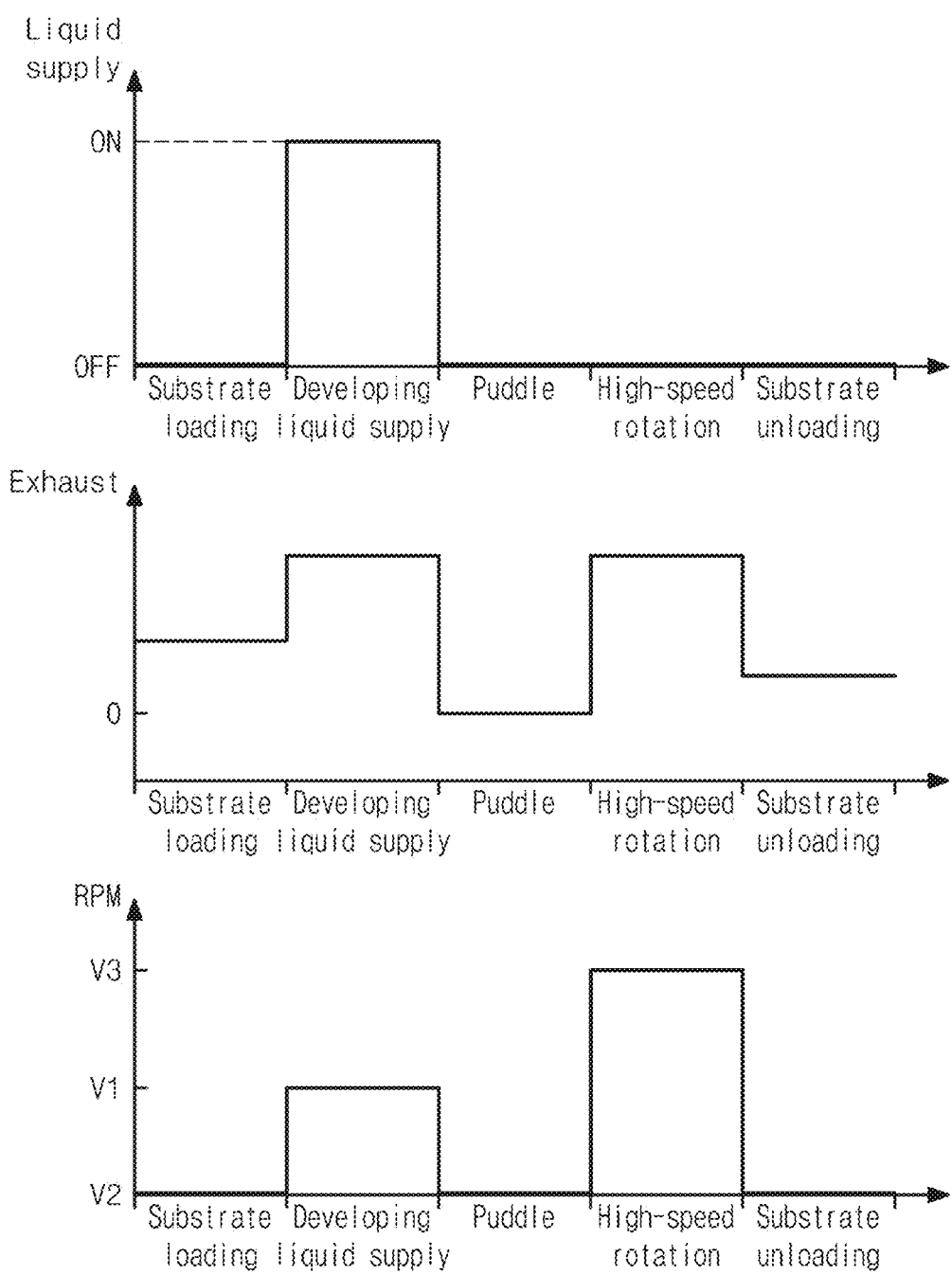
FIG. 9 is a diagram schematically illustrating an exemplary embodiment of a developing process performed in a liquid treating chamber in FIG. 5.

FIG. 9 is a diagram schematically illustrating an exemplary embodiment of a developing process performed in a liquid treating chamber in FIG. 5. Referring to FIG. 9, the developing process may be performed in the process chamber 280. The developing process may sequentially perform the substrate loading step, the developing liquid supplying step, the puddle step, the high-speed rotation step, and the substrate unloading step. The developing liquid supplying step, the puddle step, and the high-speed rotation step may be conducted at a plurality of times. Optionally, the method may further include a step of supplying deionized-water (DIW) onto the substrate after the high-speed rotation step.

In the substrate loading step, the substrate W is carried into the process chamber 280. The substrate W may be seated on a body 2832 of the support unit 2830 to be described below in the process chamber 280 by the transfer robot 224. The transfer robot 224 moves the substrate W in the lower direction. In the substrate loading step, the internal atmosphere of the process chamber 280 may be exhausted.

In the developing liquid supplying step, the developing liquid is supplied onto the substrate W installed in the support unit 2830. In the developing liquid supplying step, the substrate W rotates at a first speed. In the developing liquid supplying step, the internal atmosphere of the process chamber 280 may be exhausted.

In the puddle step, the supply of the developing liquid onto the substrate W is stopped and the developing liquid supplied onto the substrate W is maintained. In the puddle step, the substrate W rotates at a second speed slower than the first speed. Optionally, in the puddle step, the substrate W may be stopped. In the puddle step, the internal atmosphere of the process chamber 280 may not be exhausted. Optionally, the internal atmosphere of the process chamber 280 may be exhausted so that the exhaust may be conducted at an amount smaller than the exhaust amount in the developing liquid supplying step.

The high-speed rotation step of is a step of removing the developing liquid maintained on the substrate W from the puddle step. In the high-speed rotation step, the substrate W rotates at a third speed faster than the first speed. In the substrate unloading step, the substrate W is carried out from the process chamber 280. The substrate W moves in the upper direction from the support unit 2830 by the transfer robot 224. In the substrate unloading step, the internal atmosphere of the process chamber 280 may be exhausted.

Figure 10:
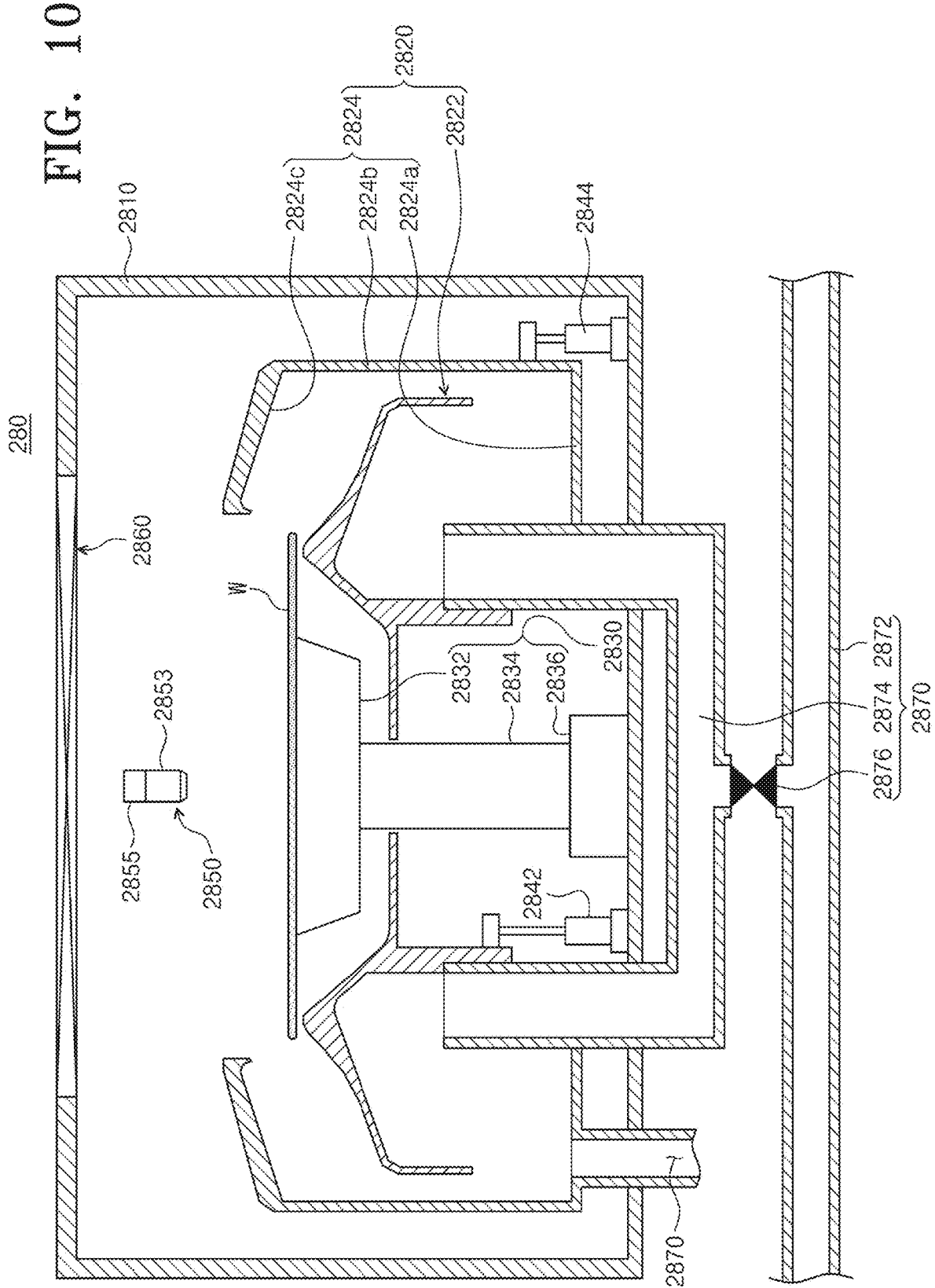
FIG. 10 is a diagram schematically illustrating an exemplary embodiment of the liquid treating chamber in FIG. 5.

FIG. 10 is a diagram schematically illustrating an exemplary embodiment of a process chamber which performs liquid treating in FIG. 5. Referring to FIG. 10, the process chamber 280 includes a housing 2810, a treating container 2820, a support unit 2830, an elevation unit 2840, a liquid supply unit 2850, an air flow supply unit 2860, and an exhaust unit 3000.

The housing 2810 provides the space therein. The housing 2810 is provided in the substantially rectangular parallelepiped shape. An opening (not illustrated) may be formed at one side of the housing 2810. The opening serves as the entrance through which the substrate W is carried in the internal space or the substrate W is taken over from the internal space. Further, in order to selectively seal the entrance, a door (not illustrated) may be installed at a region adjacent to the entrance. The door may seal the internal space by blocking the entrance while a treating process for the substrate W carried in the internal space is performed. The treating container 2820, the support unit 2830, the elevation unit 2840, and the liquid supply unit 2850 are arranged in the housing 2810.

The treating container 2820 may have a treating space of which upper portion is opened. The treating container 2820 may have a bowl having the treating space. The internal space may be provided to surround the treating space. The treating container 2820 may have a cup shape of which upper portion is opened. The treating space of the treating container 2820 may be a space in which the support unit 2830 to be described below supports and rotates the substrate W. The treating space may be a space in which the liquid supply unit 2850 to be described below supplies a fluid to treat the substrate W.

According to an example, the treating container 2820 may include an inner cup 2822 and an outer cup 2824. The outer cap 2824 may be provided to surround a circumference of the support unit 2830 and the inner cup 2822 may be positioned inside the outer cap 2824. Each of the inner cup 2822 and the outer cap 2824 may have the annular ring shape when viewed from the top. A space between the inner cup 2822 and the outer cup 2824 may be provided as a recovery path in which the fluid introduced into the treating space is recovered.

The inner cup 2822 may be provided in a shape to surround a support axis 2834 of the support unit 2830 to be described below when viewed from the top. For example, the inner cup 2822 may be provided in a circular plate shape to surround the support axis 2834 when viewed from the top. When viewed from the top, the inner cup 2822 may be positioned to overlap with an exhaust unit 3000 to be described below, which is coupled to the housing 2810.

The inner cup 2822 may have an inner portion and an outer portion. Top surfaces of the inner portion and the outer portion, respectively may be provided to have different angles based on a virtual horizontal line. For example, the inner portion may be positioned to overlap with a body 2832 of the support unit 2830 to be described below when viewed from the top. The inner portion may be positioned to face the support axis 2834. As the inner portion is away from the support axis 2834, the top surface faces a direction inclined upward and the outer portion may extend in an outer direction from the inner portion. As the top surface is away from the support axis 2834, the outer portion may face a direction of being inclined downward. An upper end of the inner portion may coincide with a side end portion of the substrate W in the up and down direction. According to an example, a point where the outer portion and the inner portion meet may be a location lower than the upper end of the inner portion. The point where the inner portion and the outer portion meet may be provided to be rounded. The outer portion is combined with the outer cup 2824 to form a recovery path in which a treating medium is recovered.

The outer cup 2824 may be provided in the cup shape to cover the support unit 2830 and the inner cup 2822. The outer cup 2824 may include a bottom portion 2824a, a side portion 2824b, and an inclination portion 2824c.

The bottom portion 2824a may have the circular plate shape with a hollow. A recovery line 2870 may be connected to the bottom portion 2824a. The recovery line 2870 may recover the treating medium supplied onto the substrate W. The treating medium recovered by the recovery line 2870 may be reused by an external reproduction system (not illustrated).

The side portion 2824b may have the annular ring shape to cover the support unit 2830. The side portion 2824b may extend in a vertical direction from a side end of the bottom portion 2824a. The side portion 2824b may extend upward from the bottom portion 2824a.

The inclination portion 2824c may extend in a direction toward a central axis of the outer cup 2824 from the upper end of the side portion 2824b. An inner surface of the inclination portion 2824c may be provided to be inclined upward to be close to the support unit 2830. The inclination portion 2824c may be provided to have the ring shape. The upper end of the inclination portion 2824c may be positioned higher than the substrate W supported on the support unit 2830 while the treating process for the substrate W is being conducted.

The support unit 2830 supports the substrate W and rotates the substrate W in the treating space. The support unit 2830 may be a chuck which supports and rotates the substrate W. The support unit 2830 may include a body 2832, a support axis 2834, and a driving unit 2836. The body 2832 may have an upper surface on which the substrate W is seated. The upper surface of the body 2832 is provided in a substantially circular shape when viewed from the top. The upper surface of the body 2832 may be provided to have a smaller diameter than the substrate W. An adsorption hole (not illustrated) is formed in the body 2832 to chuck the substrate W in a vacuum adsorption scheme. Optionally, an electrostatic plate (not illustrated) is provided in the body 2832 to chuck the substrate W in an electrostatic adsorption scheme. Optionally, support pins supporting the substrate W are provided in the body 2832, and the support pin and the substrate W are in physical contact with each other to chuck the substrate W.

The support axis 2834 is coupled to the body 2832. The support axis 2834 may be coupled to a bottom surface of the body 2832. The support axis 2834 may be provided so that the longitudinal direction faces the up and down direction. The support axis 2834 is provided to be rotatable by receiving power from the driving unit 2836. The support axis 2834 is rotated by rotating the driving unit 2836 to rotate the body 2832. The driving unit 2836 may vary a rotational speed of the support axis 2834. The driving unit 2836 may be a motor that provides driving force. However, the driving unit 2836 is not limited thereto, and may be variously modified to a known device which provides the driving force.

The elevation unit 2840 adjusts a relative height between the treating container 2820 and the support unit 2830. The elevation unit 2840 linearly moves the treating container 2820 in the third direction 6. The elevation unit 2840 may include an inner elevation member 2842 and an outer elevation member 2844. The inner elevation member 2842 may elevate and move the inner cup 2822. The outer elevation member 2844 may elevate and move the outer cup 2824.

The liquid supply unit 2850 may include a liquid nozzle 2853, an arm 2855, a rail 2857, and a driver 2859.

The liquid nozzle 2853 may supply the liquid to the substrate W supported on the support unit 2830. The liquid which the liquid nozzle 2853 supplies may be the developing liquid. Furthermore, the liquid nozzle 2853 may supply the deionized-water (DIW) to the substrate W supported on the support unit 2830. Furthermore, the liquid nozzle 2853 may supply nitrogen (N2) to the substrate W supported on the support unit 2830. In FIG. 10, it is illustrated that a single liquid nozzle 2853 is provided, the present invention is not limited thereto and a plurality of liquid nozzles 2853 may be provided.

The arm 2855 may support the arm nozzle 2853. The liquid nozzle 2853 may be installed at one end of the arm 2855. The liquid nozzle 2853 may be installed on a bottom surface of one end of the arm 2855. When viewed from the top, the liquid nozzle 2853 may be arranged in a direction parallel to the longitudinal direction of the rail 2857 to be described below. The other end of the arm 2855 may be coupled to the driver 2859.

The arm 2855 may be moved by the driver 2859. As a result, the location of the liquid nozzle 2853 installed in the arm 2855 may be changed. The movement direction of the arm 2855 may be guided along the rail 2857 in which the driver 2859 is installed. The rail 2857 may be provided so that the longitudinal direction faces the horizontal direction. For example, the rail 2857 may be provided so that the longitudinal direction faces the direction parallel to the first direction 2. Optionally, the arm 2855 may be coupled and rotated to the rotational axis of which longitudinal direction faces the third direction 6. The rotational axis may be rotated by the driver. As a result, the location of the liquid nozzle 2853 installed in the arm 2855 may be changed.

An air flow supply unit 2860 supplies an air flow to the internal space of the housing 2810. The air flow supply unit 2860 may supply a descending air flow to the internal space. The air flow supply unit 2860 may supply an air flow of which temperature and/or humidity is controlled to the internal space. The air flow supply unit 2860 may be installed in the housing 2810. The air flow supply unit 2860 may be installed above the treating container 2820 and the support unit 2830. The air flow supply unit 2860 may include a fan 2862, an air flow supply line 2864, and a filter 2866. The air flow supply unit 2864 may supply an external air flow of which temperature and/or humidity is controlled to the internal space. The filter 2864 may be installed in the air flow supply line 2866. The filter 2866 may remove impurities included in the external air flow which flows on the air flow supply line 2864. When the fan 2862 is driven, the eternal air flow supplied by the air flow supply line 2864 may be uniformly delivered to the internal space.

The exhaust unit 3000 exhausts the atmosphere of the treating space. The exhaust unit 3000 may include an integrated exhaust line 3200, an exhaust line 3400, and an exhaust valve 3600.

The integrated exhaust line 3200 may be provided outside the process chamber 280. A pressure reduction unit (not illustrated) is installed in the integrated exhaust line 3200. The integrated exhaust line 3200 exhausts an atmosphere inside the treating space by the pressure reduction unit.

The exhaust line 3400 may be coupled to the treating container 2820. Optionally, the exhaust line 3400 may be coupled to the bottom portion 2824*a* of the outer cup 2824. When viewed from the top, the exhaust line 3400 may be positioned to overlap with the inner cup 2822. The exhaust line 3400 connects the process chamber 280 and the integrated exhaust line 3200. The internal atmosphere of the process chamber is exhausted to the integrated exhaust line 3400 through the exhaust line 3200.

The exhaust valve 3600 may be installed in the exhaust line 3400. The exhaust valve 3600 may open/close the exhaust line 3400. Optionally, the exhaust valve 3600 may adjust an exhaust flow rate of the exhaust line 3400. The exhaust valve 3600 may be provided an on/off valve or a flow rate adjustment valve. The exhaust valve 3600 is not limited thereto, and the exhaust valve 3600 may be provided as various know valves capable of adjusting the exhaust amount.

Figure 11:
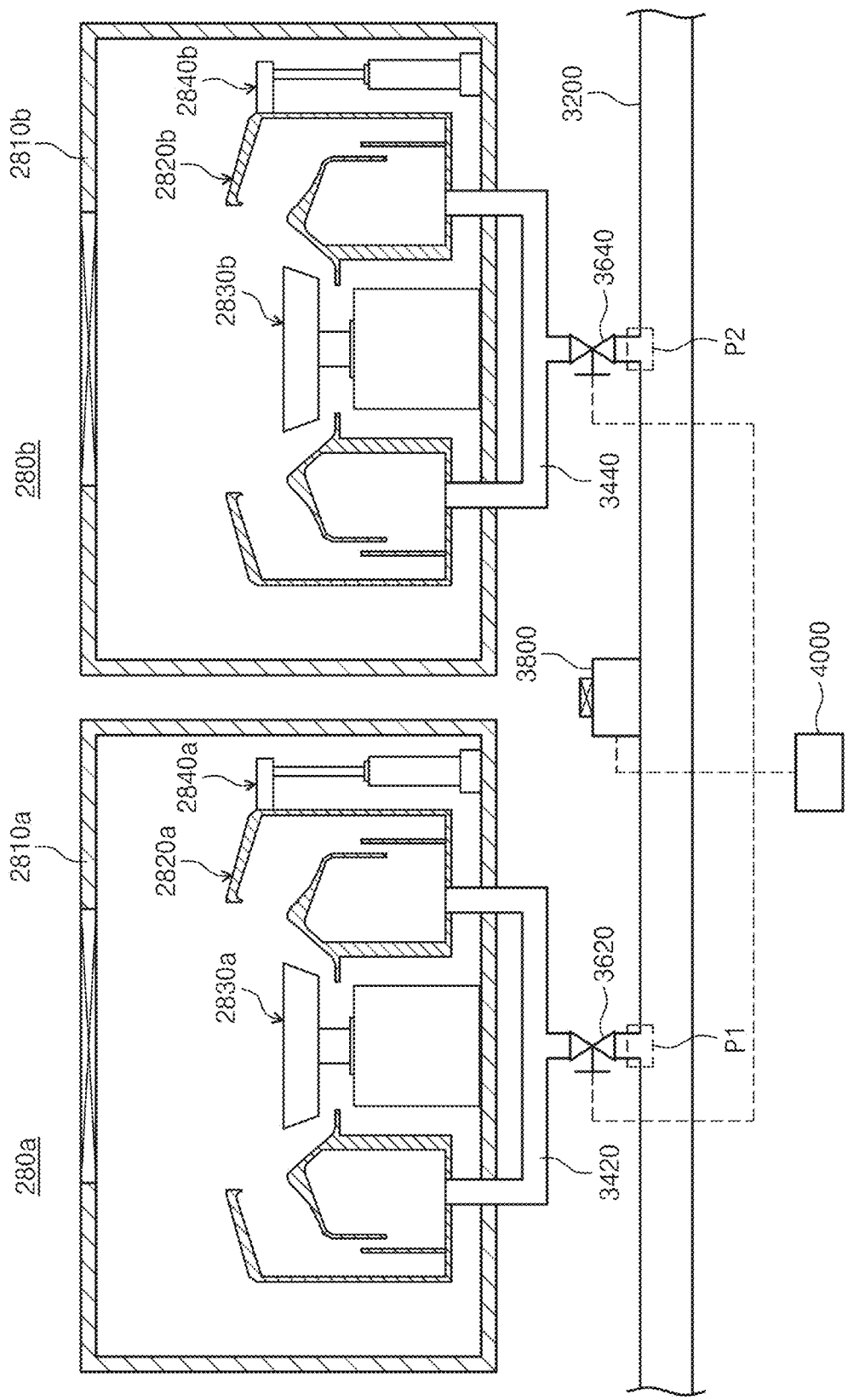
FIG. 11 is a diagram schematically illustrating an exemplary embodiment of an interference alleviation unit.
Figure 12:
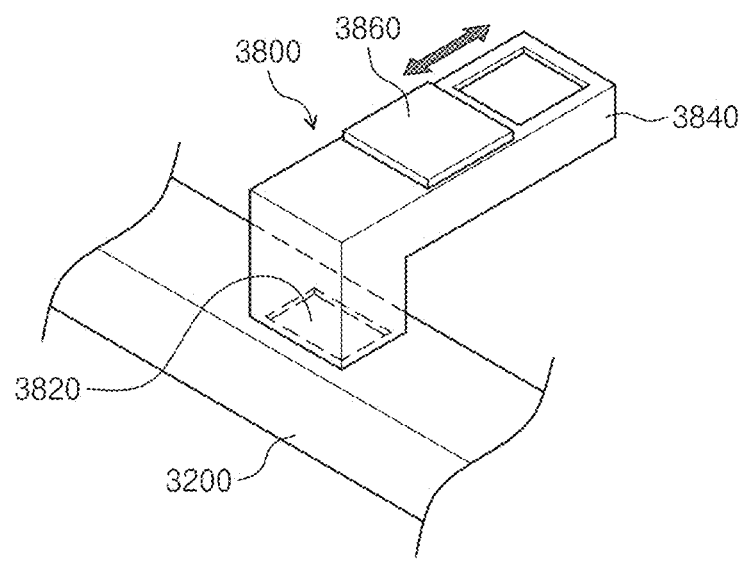
FIGS. 12 and 13 are enlarged perspective views of the interference alleviation unit in FIG. 11.
Figure 13:
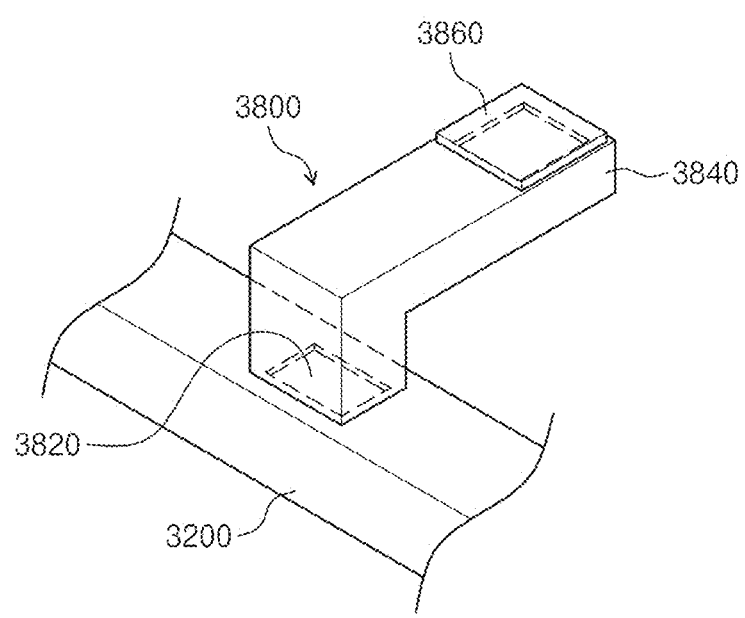

FIG. 11 is a diagram schematically illustrating an exemplary embodiment of an interference alleviation unit. FIGS. 12 and 13 are enlarged perspective views of the interference alleviation unit in FIG. 11.

Referring to FIGS. 11 to 13, a plurality of process chambers 280 may be provided. As an example, the process chamber 280 may include a first process chamber 280*a* and a second process chamber 280*b*. The first process chamber 280*a* includes a first housing 2810*a*, a first treating container 2820*a*, a first support unit 2830*a*, a first elevation unit 2840*a*, and a first liquid supply unit 2850*a*. The second process chamber 280*b* includes a second housing 2810*b*, a second treating container 2820*b*, a second support unit 2830*b*, a second elevation unit 2840*b*, and a second liquid supply unit 2850*b*. The housings 2820*a* and 2820*b*, the support units 2830*a* and 2830*b*, the elevation units 2840*a* and 2840*b*, and the liquid supply units 2850*a* and 2850*b* are provided similarly to the housing 2820, the support unit 2830, the elevation unit 2840, the liquid supply unit 2580, and the air flow supply unit 2860 in the exemplary embodiment of FIG. 10.

The exhaust unit 3000 exhausts the atmosphere of the treating space. The exhaust unit 300 includes an integrated exhaust line 3200, a first exhaust line 3420, a second exhaust line 3400, a first valve 3620, a second valve 3640, and an interference alleviation unit 3800.

The integrated exhaust line 3200 may be provided outside the process chamber 280. A pressure reduction unit (not illustrated) is installed in the integrated exhaust line 3200. The integrated exhaust line 3200 exhausts an atmosphere inside the treating space by the pressure reduction unit.

The first exhaust line 3420 may be coupled to the first treating container 2820. The first exhaust line 3420 connects the first process chamber 280*a* and the integrated exhaust line 3200. The first exhaust line 3420 connects the first process chamber 280*a* and a first point P1 of the integrated exhaust line 3200. The internal atmosphere of the first process chamber 280*a* is exhausted to the integrated exhaust line 3400 through the first exhaust line 3420.

The second exhaust line 3440 may be coupled to the second treating container 2820*b*. The second exhaust line 3440 connects the second process chamber 280*b* and the integrated exhaust line 3200. The second exhaust line 3440 connects the second process chamber 280*b* and a second point P2 of the integrated exhaust line 3200. The internal atmosphere of the second process chamber 280*b* is exhausted to the integrated exhaust line 3400 through the second exhaust line 3440.

The first valve 3620 may be installed in the first exhaust line 3420. The first valve 3620 may open/close the first exhaust line 3420. Optionally, the first valve 3620 may adjust an exhaust flow rate of the first exhaust line 3420. The first valve 3620 may be provided an on/off valve or a flow rate adjustment valve. The first valve 3620 is not limited thereto, and the first valve 3620 may be provided as various know valves capable of adjusting the exhaust amount.

The second valve 3640 may be installed in the second exhaust line 3440. The second valve 3640 may open/close the second exhaust line 3440. Optionally, the second valve 3640 may adjust an exhaust flow rate of the second exhaust line 3440. The second valve 3640 may be provided an on/off valve or a flow rate adjustment valve. The second valve 3640 is not limited thereto, and the second valve 3640 may be provided as various know valves capable of adjusting the exhaust amount.

The interference alleviation unit 3800 alleviates exhaust interference between the first process chamber 280*a* and the second process chamber 280*b*. The interference alleviation unit 3800 may be provided in the integrated exhaust line 3200. The interference alleviation unit 3800 may be provided between the first point P1 where the first process chamber 280*a* and the first exhaust line 3420 are connected and the second point P2 where the second process chamber 280*b* and the second exhaust line 3440 are connected in the integrated exhaust line 3200.

The interference alleviation unit 3800 may include a discharge unit 3820 which may discharge some of the air flow exhausted from the inside of the integrated exhaust line 3200 to the outside of the integrated exhaust line 3200. Optionally, the discharge unit 3820 may discharge some of the air flow exhausted from the inside of the integrated exhaust line 3200 from the integrated exhaust line 3200 to the atmosphere.

The discharge unit 3820 is provided as a path in which the atmosphere is discharged in the integrated exhaust line 3200. One end of the path is connected to the integrated exhaust line 3200. An opening which is in communication with the outside of the integrated exhaust line 3200 is formed at the other end of the path. One end of the path may be extended vertically to a ground surface from the integrated exhaust line 3200. The other end of the path is extended from one end, and extended in a horizontal direction to the ground surface, and the opening may be formed at the end. However, the path is not limited thereto and the path may be provided in various shapes.

The discharge unit 3820 may have a door 3860 for opening/closing the opening of the end of the path. The door 3860 may be provided as a movable door plate. The door 3860 is not limited thereto, and the door 3860 may be provided in various openable/closable structures.

The controller 4000 may control the first valve 3620, the second valve 3640, and the door 3860. The controller 4000 may control opening/closing of the first valve 3620 and the second valve 3640. The controller 4000 may control the opening/closing the door 3860. As an example, when the controller 4000 controls to open the door 3860, some of the air flow exhausted from the inside of the integrated exhaust line 3200 may be discharged to the outside of the integrated exhaust line 3200 through the path.

Figure 14:
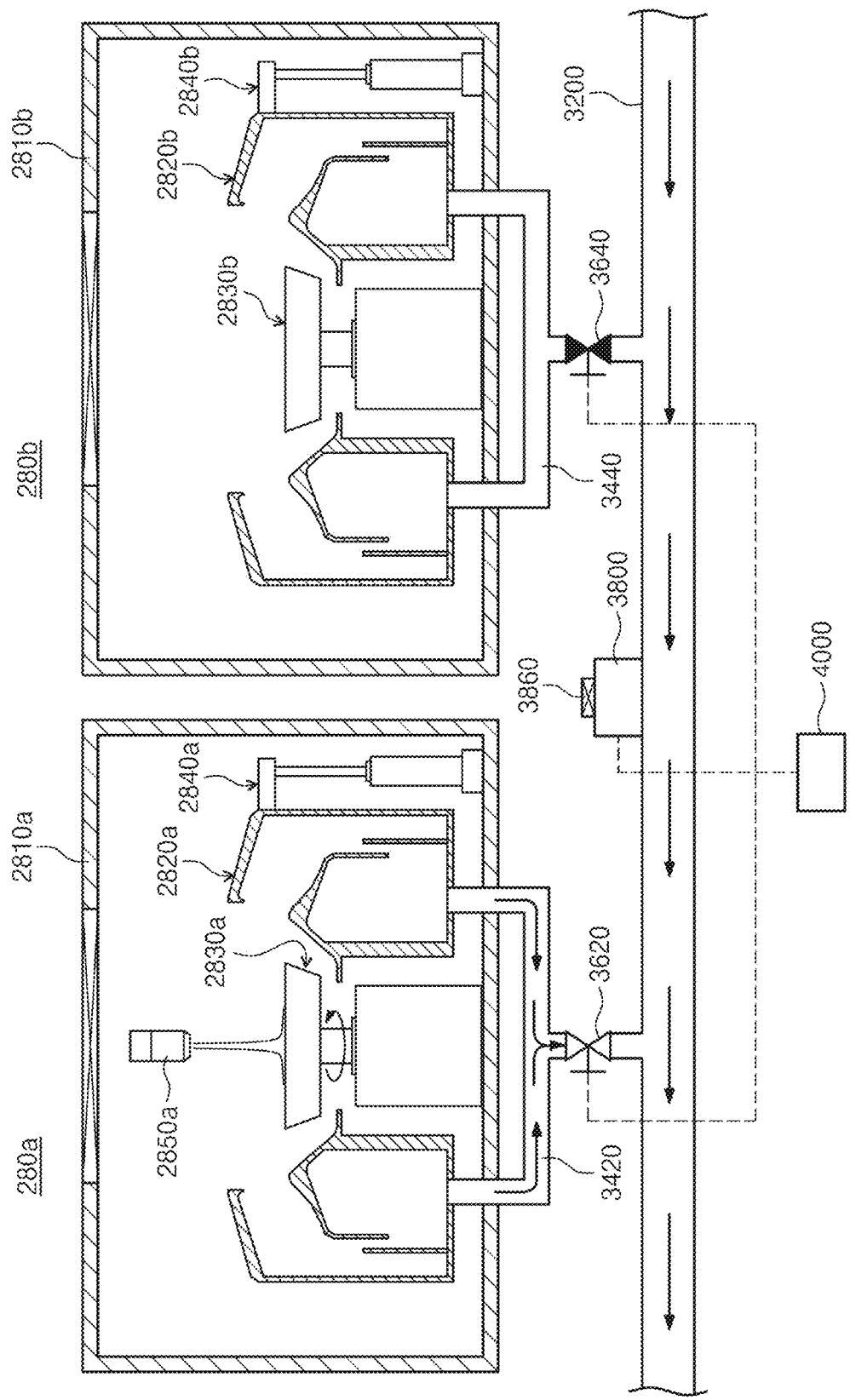
FIGS. 14 to 16 are diagrams schematically illustrating a flow of an air flow in an integrated exhaust line depending on the developing process in FIG. 11.
Figure 15:
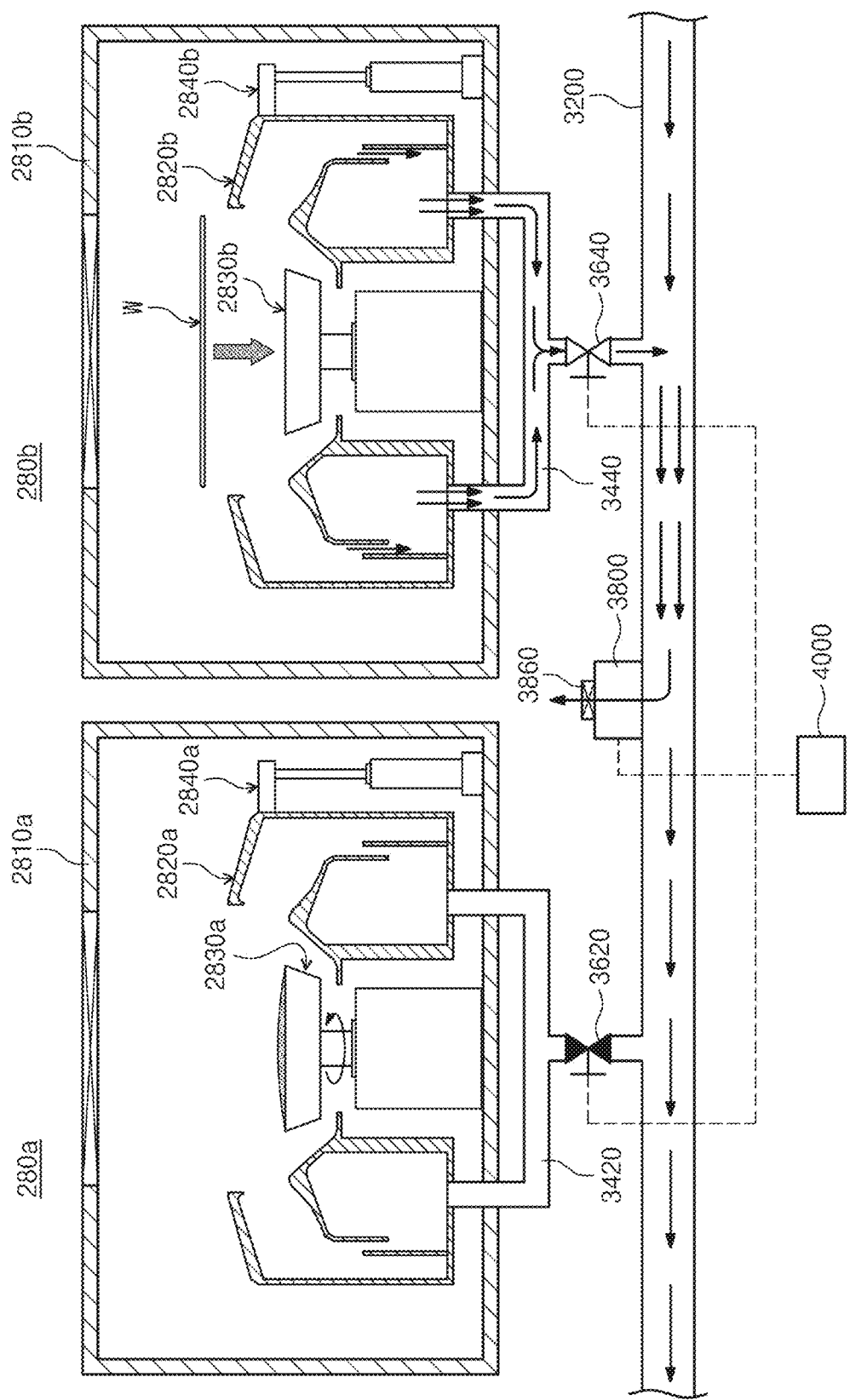
Figure 16:
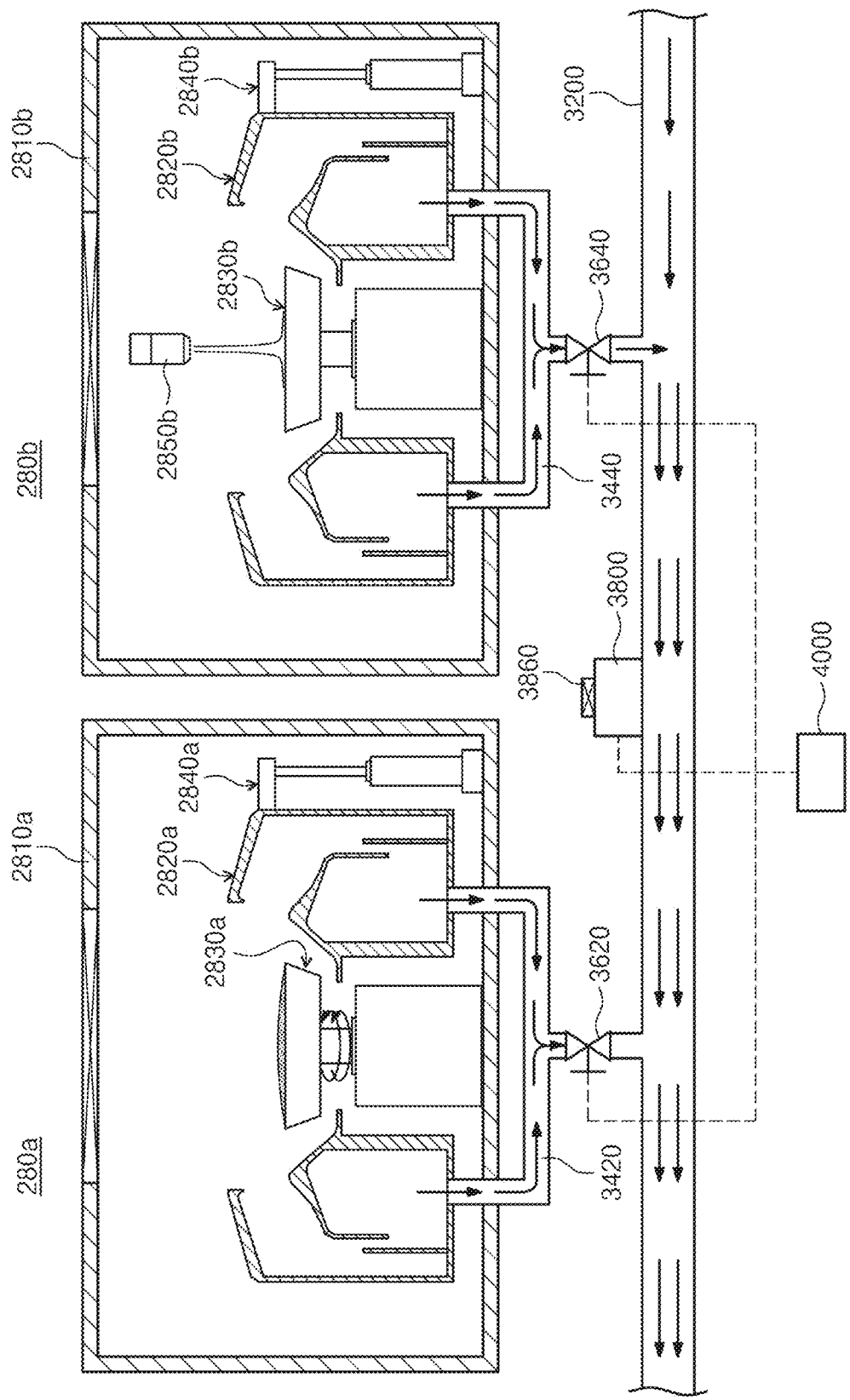
Figure 17:
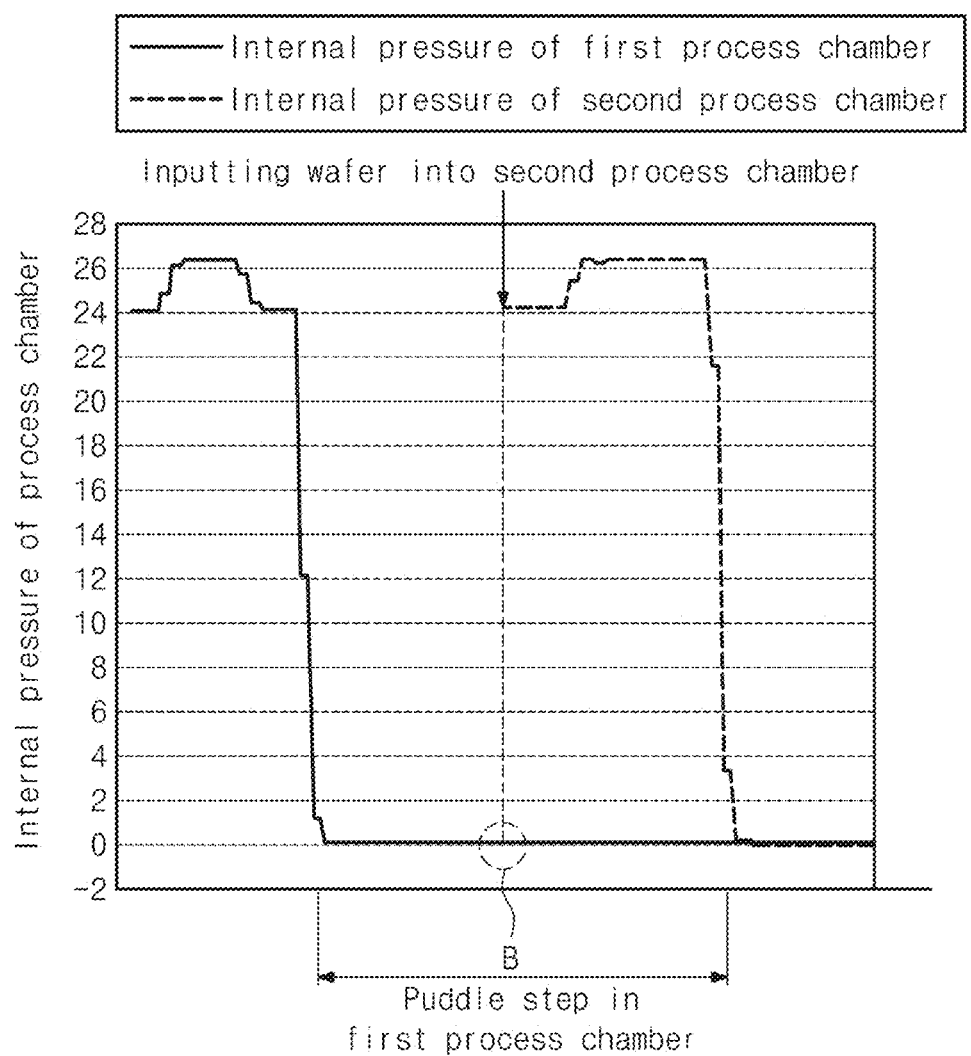
FIG. 17 is a diagram schematically illustrating an internal pressure of a first process chamber in FIG. 11.

FIGS. 14 to 16 are diagrams schematically illustrating a flow of an air flow in an integrated exhaust line in FIG. 11. FIG. 17 is a diagram schematically illustrating an internal pressure of a first process chamber in FIG. 11. Hereinafter, the flow of the air flow in the integrated exhaust line 8300 depending on the developing process will be described in detail.

Referring to FIG. 14, the developing liquid supplying step is conducted in the first process chamber 280a. The first liquid supply unit 2850a discharges the developing liquid to the substrate W which is seated on the first support unit 2830a of the second process chamber 280a and rotated. The controller 4000 opens the first valve 3620. The internal atmosphere of the first process chamber 280a is exhausted by the first exhaust line 3420 connected to the integrated exhaust line 3200. The controller 4000 closes the door 3860 of the interference alleviation unit 3800.

Referring to FIG. 15, the puddle step is conducted in the first process chamber 280a. The first liquid supply unit 2850a stops the supply of the developing liquid onto the substrate W. The first support unit 2830a may provide the substrate W to be rotated at the low speed or the substrate W to be stopped. The controller 4000 may control the first valve 3620 so that an opening rate of the first exhaust line 3420 is smaller than that in the developing liquid supplying step and/or the high-speed rotation step. Optionally, the controller 4000 may control to close the first valve 3620 so as to prevent the first exhaust line 3420 from being opened. As a result, the inside of the first process chamber 280a may not be exhausted or a small amount may be exhausted.

In the second process chamber 280b, the substrate loading step is conducted. The transfer robot 224 may transfer the substrate W on the second support unit 2830b. The transfer robot 224 may move the substrate W in the lower direction. The controller 4000 opens the second valve 3640 to exhaust the internal atmosphere of the second process chamber 280b. As a result, the air flow discharged from the second process chamber 280b is introduced into the integrated exhaust line 3200.

The controller 4000 opens the door 3860 of the interference alleviation unit 3800. Some of the air flow exhausted from the inside of the integrated exhaust line 3200 is discharged to the interference alleviation unit 3800 positioned between the first process chamber 280a and the second process chamber 280b. The air flow introduced into the path of the interference alleviation unit 3800 is discharged to the outside of the integrated exhaust line 3200 through the opened door 3860.

When the puddle step is conducted in the first process chamber 280a, the developing liquid supplied onto the substrate W should be maintained in a constant state. When the internal pressure of the first process chamber 280a is changed, the developing liquid maintained on the substrate W is shook. The developing liquid maintained on the substrate W is affected by the internal pressure of the first process chamber 280a. As a result, when the puddle step is conducted, the internal pressure of the first process chamber 280a should be maintained constantly. When the substrate W is seated on the second support unit 2830b in the second process chamber 280b, the substrate W is moved in the lower direction by the transfer robot 224. In this process, a descending pressure of an air layer is generated inside the second process chamber 280b. As a result, the exhaust amount discharged from the second process chamber 280b to the second exhaust line 3400 temporarily increases. Although the first exhaust line 3420 provided in the first process chamber 280a in which the puddle step is being conducted is closed or a part is opened, the exhaust air flow which temporarily increases is introduced into the integrated exhaust line 3200 from the second process chamber 280b to affect the internal pressure of the first process chamber 280b.

The interference alleviation unit 3800 is arranged between the first process chamber 280a and the second process chamber 280b to discharge some of the air flow inside the integrated exhaust line 3200 to the interference alleviation unit 3800. As a result, the change in internal pressure by the exhaust interference in the first process chamber 280a in which the puddle process is being conducted in the adjacent second process chamber 280b may be minimized. The internal pressure of the first process chamber 280a is maintained constantly to maintain the developing liquid on the substrate W, thereby effectively perform the developing process.

Referring to FIG. 16, the high-speed rotation step is conducted in the first process chamber 280a. The first support unit 2830a rotates at a higher speed than that in the developing liquid supplying step or/and the puddle step. The controller 4000 opens the first valve 3620. The internal atmosphere of the first process chamber 280a is exhausted by the first exhaust line 3420 connected to the integrated exhaust line 3200. The controller 4000 closes the door 3860 of the interference alleviation unit 3800.

In the second process chamber 280b, a developing liquid supplying step is conducted. The second liquid supply unit 2850b discharges the developing liquid to the substrate W which is seated on the second support unit 2830b of the second process chamber 280b and rotated. The controller 4000 opens the second valve 3640. The internal atmosphere of the second process chamber 280b is exhausted by the second exhaust line 3440 connected to the integrated exhaust line 3200.

Referring to FIG. 17, the interference alleviation unit 3800 is arranged between the first process chamber 280a and the second process chamber 280b to discharge some of the air flow inside the integrated exhaust line 3200 to the interference alleviation unit 3800. As a result, the entirety of the air flow inside the integrated exhaust line 3200 reaching the first process chamber 280a may be minimized. The change in internal pressure of the first process chamber 280a in which the puddle process is being conducted may be minimized at point B which is a time point of loading the substrate in the second process chamber 280b positioned adjacent to the first process chamber 280a. The internal pressure of the first process chamber 280a is maintained constantly to maintain the developing liquid on the substrate W, thereby effectively perform the developing process.

Figure 18:
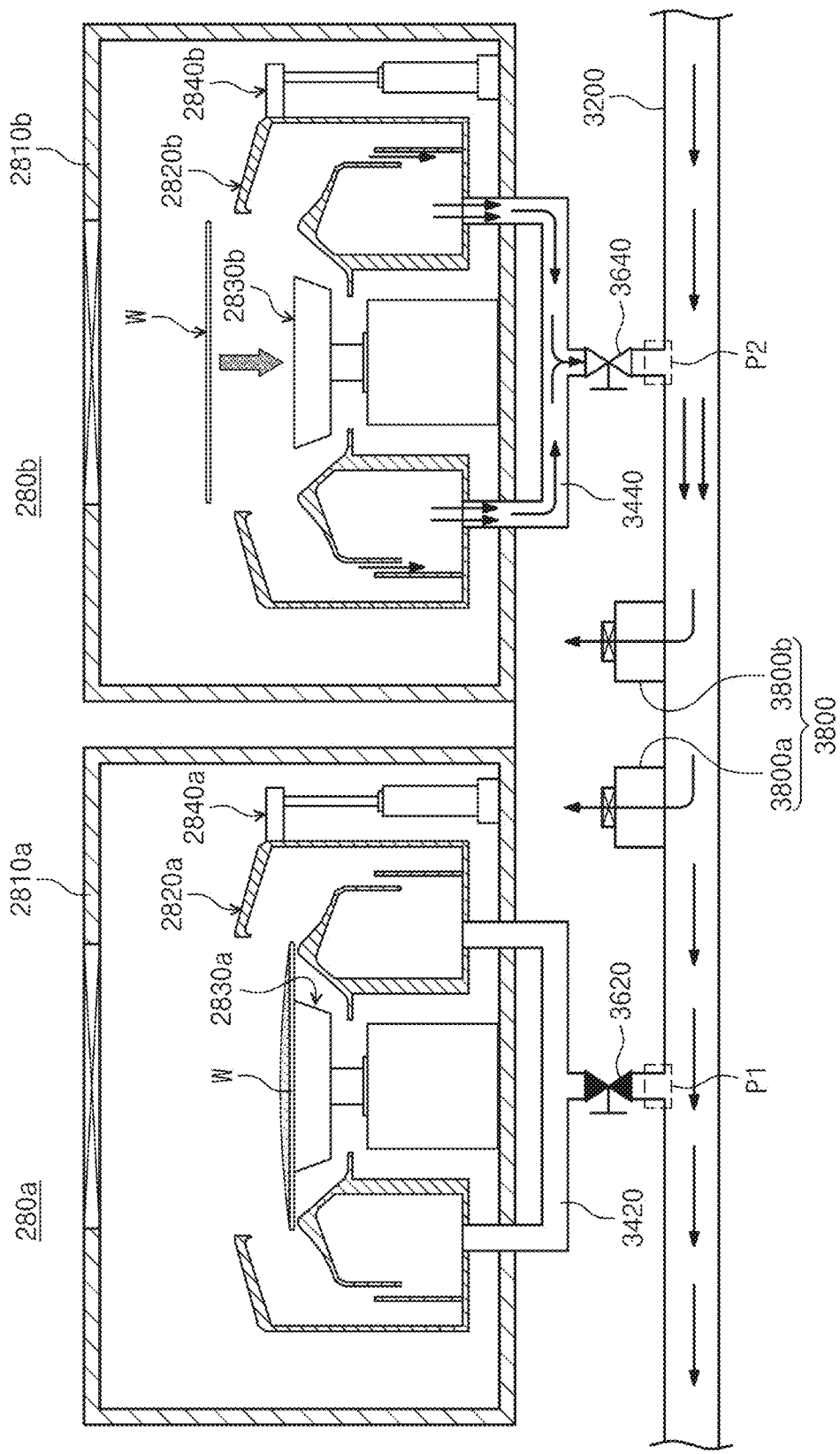
FIGS. 18 to 20 are diagrams schematically illustrating another exemplary embodiment of the interference alleviation unit in FIG. 11.
Figure 19:
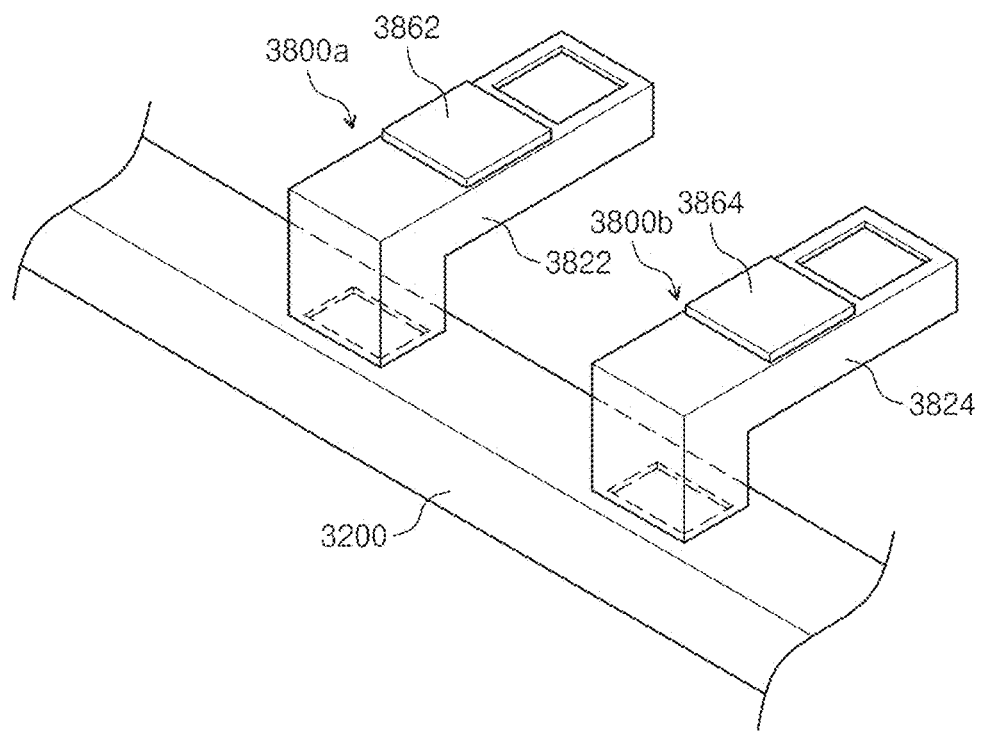
Figure 20:
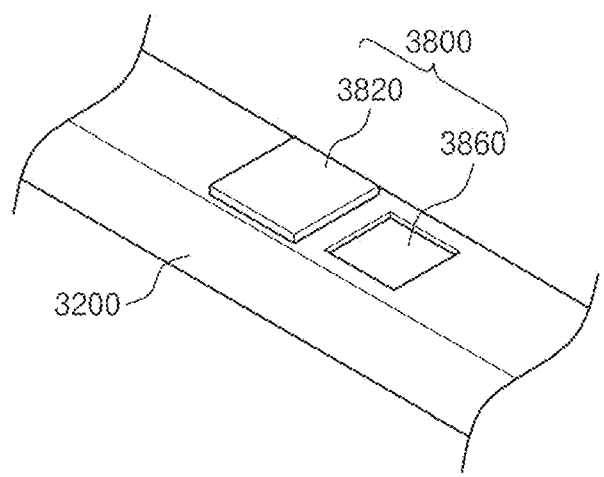

FIGS. 18 to 20 are diagrams schematically illustrating another exemplary embodiment of the interference alleviation unit in FIG. 11. Referring to FIGS. 17 to 19, the interference alleviation unit 3800 alleviates exhaust interference between the first process chamber 280a and the second process chamber 280b. The interference alleviation unit 3800 may be provided in the integrated exhaust line 3200. The interference alleviation unit 3800 may be provided between the first point P1 where the first process chamber 280a and the first exhaust line 3420 are connected and the second point P2 where the second process chamber 280b and the second exhaust line 3440 are connected in the integrated exhaust line 3200. The interference alleviation unit 3800 may include a discharge unit 3820 which may discharge some of the air flow exhausted from the inside of the integrated exhaust line 3200 to the outside of the integrated exhaust line 3200. Optionally, the discharge unit 3820 may discharge some of the air flow exhausted from the inside of the integrated exhaust line 3200 from the integrated exhaust line 3200 to the atmosphere.

The interference alleviation unit 3800 may include a first interference alleviation unit 3800a and a second interference alleviation unit 3800b. The first interference alleviation unit 3800a may be provided at a location adjacent to the first point P1 to which the first exhaust line 3420. The interference alleviation unit 3800 may include the first discharge unit 3822. The discharge unit 3822 is provided as a first path in which the atmosphere is discharged in the integrated exhaust line 3200. One end of the first path may be extended vertically to a ground surface from the integrated exhaust line 3200. The other end of the first path is extended from one end, and extended in a horizontal direction to the ground surface, and the opening may be formed at the end. A shape of the first path is not limited thereto and the shape of the first path may be provided as various shapes. The first discharge unit 3822 may have a first door 3862 for opening/closing the opening of the end of the first path. The first door 3862 may be provided as a movable door plate. The first door 3862 is not limited thereto, and the first door 3862 may be provided as various known devices.

The second interference alleviation unit 3800b may be provided at a location adjacent to the second point P2 to which the second exhaust line 3440. The second interference alleviation unit 3800b may include the second discharge unit 3824. The second discharge unit 3824 is provided as a second path in which the atmosphere is discharged in the integrated exhaust line 3200. The second path and the second door 3864 are provided similarly to the first path and the first door 3862, respectively, so a description thereof will be omitted hereinbelow.

The controller 4000 may control the first valve 3620, the second valve 3640, the first door 3862, and the second door 3864. The controller 4000 may control opening/closing of the first valve 3620 and the second valve 3640. The controller 4000 may control opening/closing of the first door 3862 and the second door 3864. As an example, when the controller 4000 controls to open the first door 3862, some of the air flow exhausted from the inside of the integrated exhaust line 3200 may be discharged to the outside of the integrated exhaust line 3200 through the first path. Optionally, when the controller 4000 controls to open the second door 3864, some of the air flow exhausted from the inside of the integrated exhaust line 3200 may be discharged to the outside of the integrated exhaust line 3200 through the second path. Optionally, when the controller 4000 controls to open both the first door 3862 and the second door 3864, some of the air flow exhausted from the inside of the integrated exhaust line 3200 may be discharged to the outside of the integrated exhaust line 3200 through the second path and the other some may be discharged to the outside of the integrated exhaust line 3200 through the first path. When the controller 4000 closes both the first door 3862 and the second door 3864, the air flow inside the integrated exhaust line 3200 is exhausted through the integrated exhaust line 3200.

When the puddle step is conducted in the first process chamber 280a and the developing process is conducted in the second process chamber 280b, the controller 4000 closes the first valve 3620 or controls the exhaust flow rate of the first process chamber 280a to be smaller than that in the second process chamber in which the developing process is conducted. Further, the controller 4000 opens the first door 3862 of the first discharge unit 3822. Optionally, the controller 4000 may open both the first door 3862 of the first discharge unit 3822 and the second door 3864 of the second discharge unit 3824.

When the puddle step is conducted in the first process chamber 280a and the substrate loading step is conducted in the second process chamber 280b, the controller 4000 closes the first valve 3620 or controls the exhaust flow rate of the first process chamber 280a to be smaller than that in the second process chamber in which the developing process is conducted. Further, the controller 4000 opens the first door 3862 and the second door 3864 of the first discharge unit 3822.

When the substrate loading step is conducted in the second process chamber 280b adjacent to the first process chamber 280a, the descending pressure of the air layer is generated inside the second process chamber 280b due to descending movement of the substrate. The exhaust amount discharged from the second process chamber 280b to the second exhaust line 3400 temporarily increases. As a result, when the puddle step is conducted in the first process chamber 280a and the substrate loading step is conducted in the second process chamber 280b, the exhaust interference in the first process chamber 280a is maximized. When the interference in the first process chamber 280a in which the puddle step is being conducted is maximized, both the first door 3862 and the second door 3864 provided between the first process chamber 280a and the second process chamber 280b are opened to minimize the exhaust interference in the first process chamber 280a. Optionally, when there may be interference in the internal pressure of the first process chamber 280a in which the puddle step is being conducted, only the first door 3862 provided at a location adjacent to the first process chamber 280a is opened to plan efficient exhaustion.

Referring to FIG. 20, the interference alleviation unit 3800 may be provided in the integrated exhaust line 3200. The interference alleviation unit 3800 may include a discharge unit 3820 which may discharge some of the air flow exhausted from the inside of the integrated exhaust line 3200 to the outside of the integrated exhaust line 3200. Optionally, some of the air flow exhausted from the inside of the integrated exhaust line 3200 may be discharged from the integrated exhaust line 3200 to the atmosphere. An opening which is in communication with the outside of the integrated exhaust line 3200 is formed in the discharge unit 3820. Optionally, the opening which is in communication with the outside of the integrated exhaust line 3200 and the door 3680 capable of opening/closing the opening may be provided in the discharge unit 3820. The door 3860 may be provided as a movable door plate. The door 3860 is not limited thereto, and the door 3860 may be provided as various known openable/closable devices.

Figure 21:
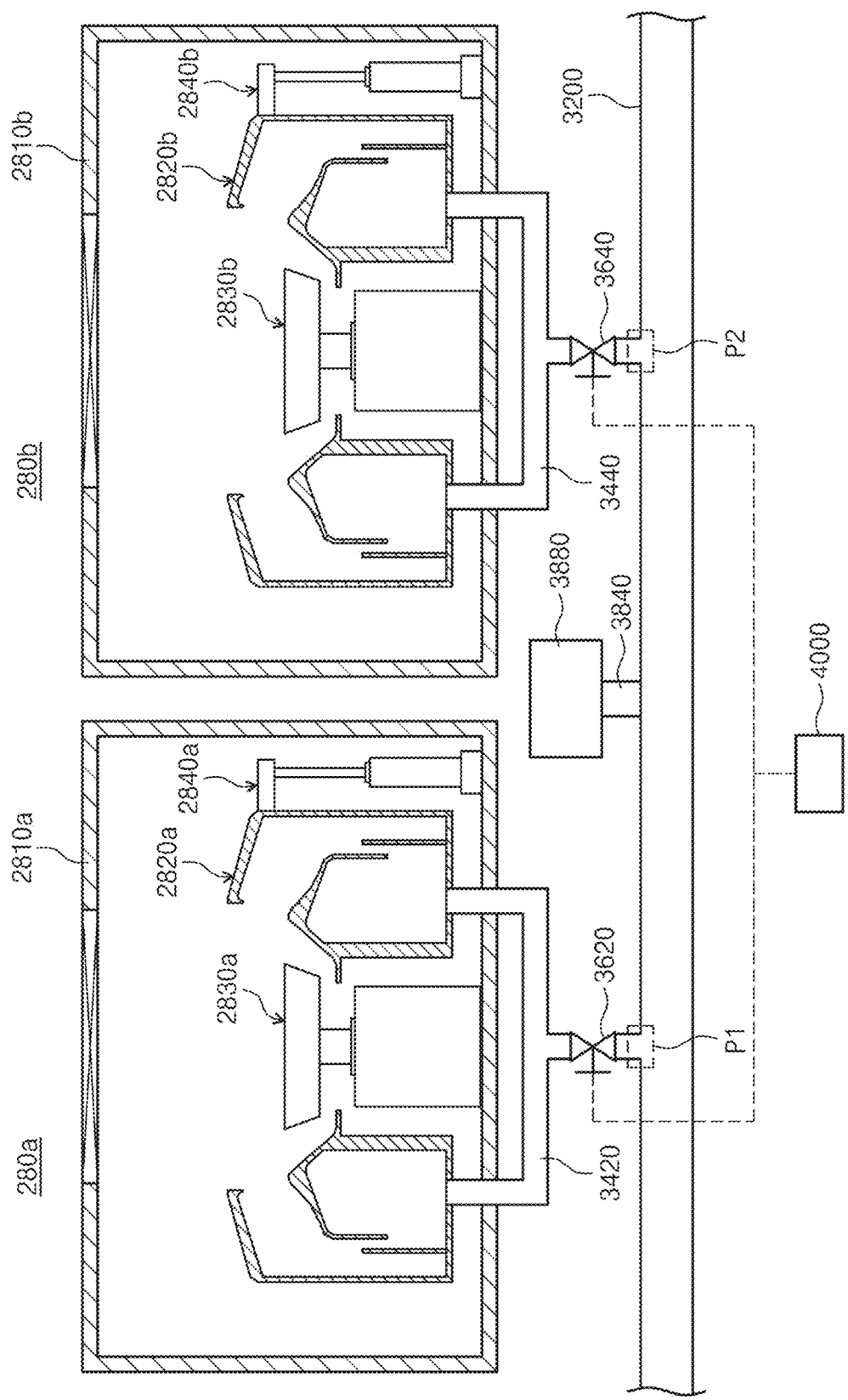
FIG. 21 is a diagram schematically illustrating another exemplary embodiment of the interference alleviation unit in FIG. 11.
Figure 22:
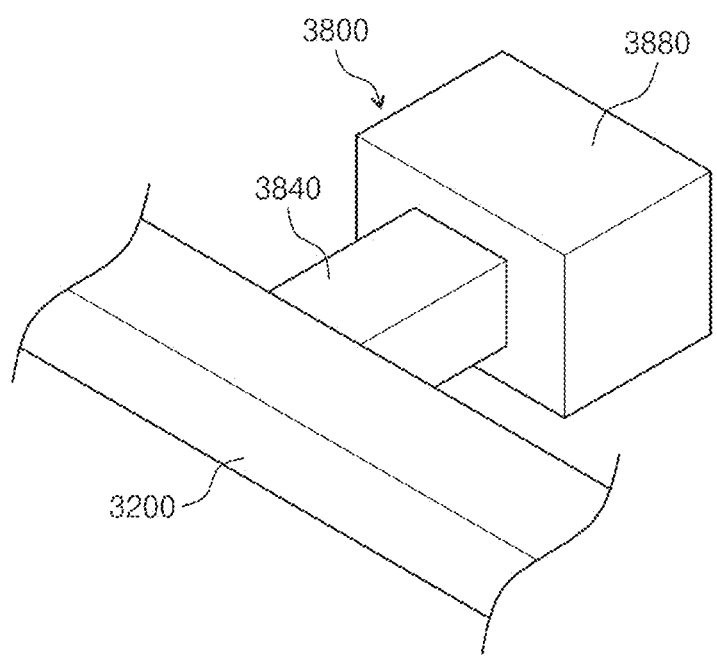
FIG. 22 is an enlarged perspective view of the interference alleviation unit in FIG. 21.

FIG. 21 is a diagram schematically illustrating another exemplary embodiment of the interference alleviation unit in FIG. 11. FIG. 22 is an enlarged perspective view for the interference alleviation unit in FIG. 21. The exemplary embodiment described in FIGS. 21 and 22 includes the housing 2810, the treating container 2820, the support unit 2830, the elevation unit 2840, the liquid supply unit 2850, and the air flow supply unit 2860 of the process chamber 280 in FIG. 11.

Referring to FIGS. 21 to 22, the interference alleviation unit 3800 alleviates exhaust interference between the first process chamber 280a and the second process chamber 280b. The interference alleviation unit 3800 may be provided in the integrated exhaust line 3200. The interference alleviation unit 3800 may be provided between the first point P1 where the first process chamber 280a and the first exhaust line 3420 are connected and the second point P2 where the second process chamber 280b and the second exhaust line 3440 are connected in the integrated exhaust line 3200. Optionally, a plurality of interference alleviation units 3800 may be provided between the first point P1 and the second point P2.

The interference alleviation unit 3800 may include a discharge unit 3820 which may discharge some of the air flow exhausted from the inside of the integrated exhaust line 3200 to the outside of the integrated exhaust line 3200. The discharge unit 3820 may include an interference alleviation line 3840 and a buffer member 3880.

One end of the inference alleviation line 3840 is connected to the integrated exhaust line 3200. The other end of the interference alleviation line 3840 is connected to the buffer member 3880 providing a buffer space. The buffer member 3880 provides the buffer space in which some of the air flow exhausted from the integrated exhaust line 3200 stays. The buffer member 3880 may be provided in a substantially regular hexahedral shape. However, the buffer member 3880 is not limited thereto and may be provided in various shapes.

The controller 4000 may control opening/closing of the first valve 3620 and the second valve 3640. The controller 4000 may control opening rates of the first valve 3620 and the second valve 3640.

Figure 23:
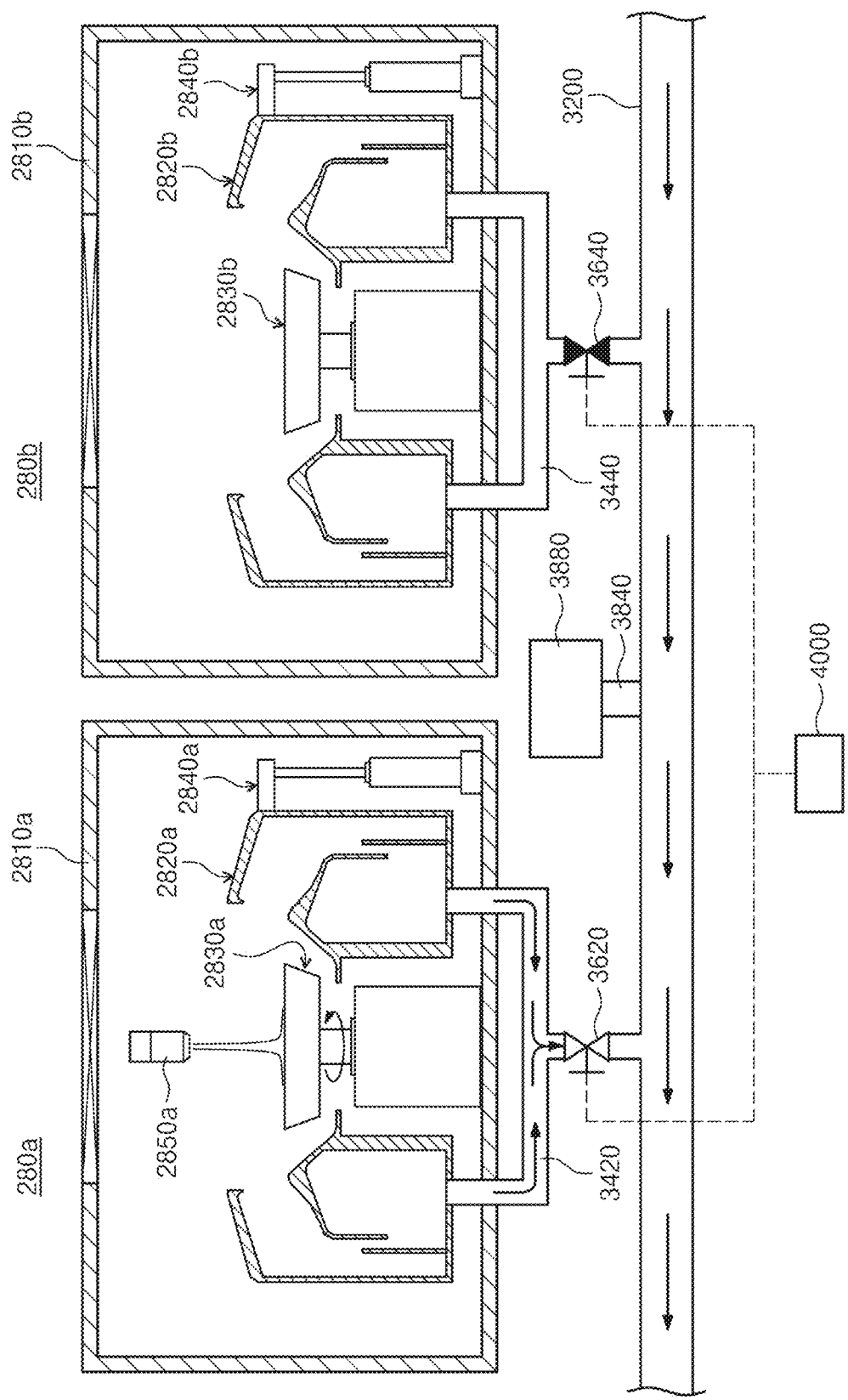
FIGS. 23 to 25 are diagrams schematically illustrating a flow of an air flow in an integrated exhaust line depending on the developing process in FIG. 21.
Figure 24:
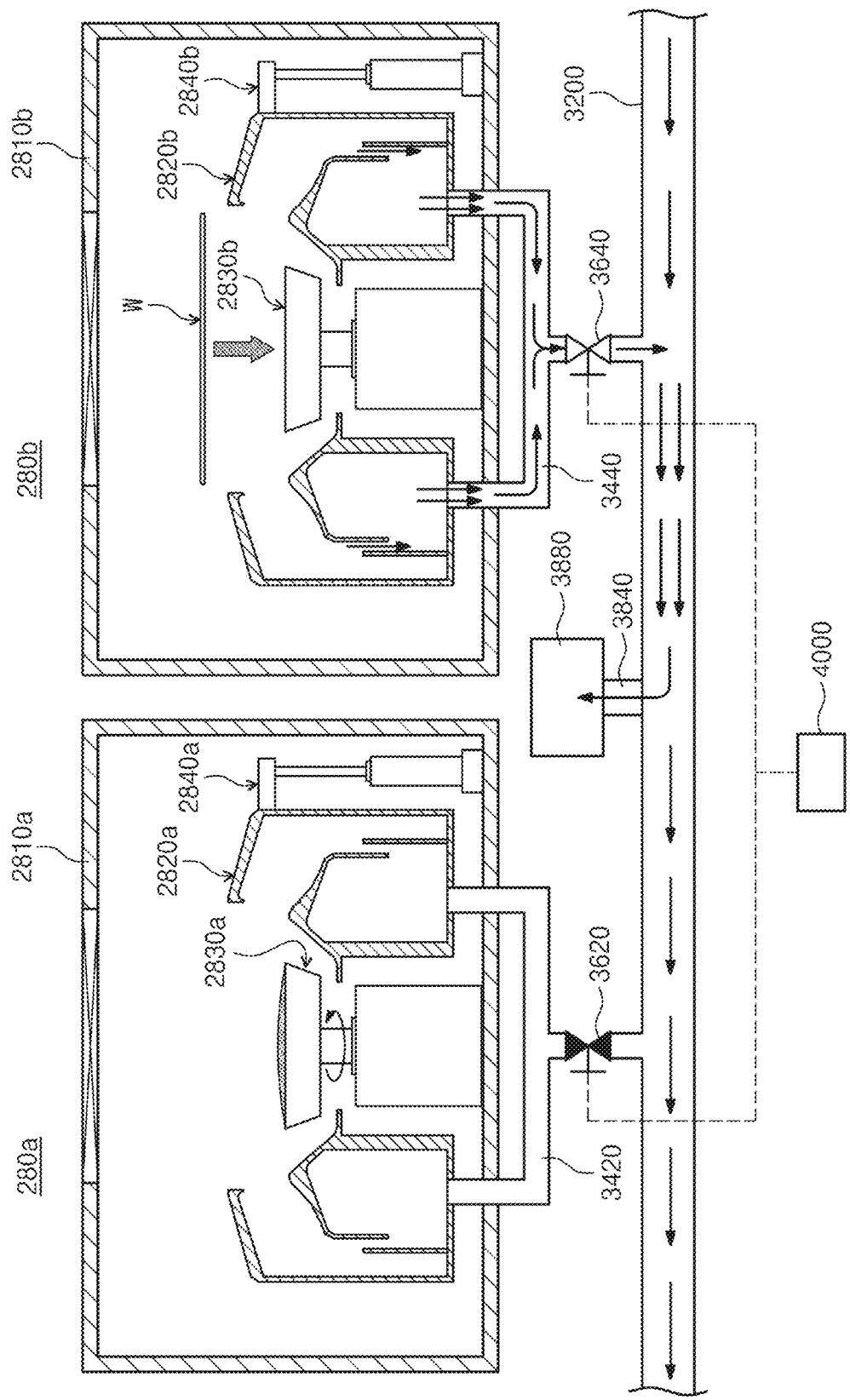
Figure 25:
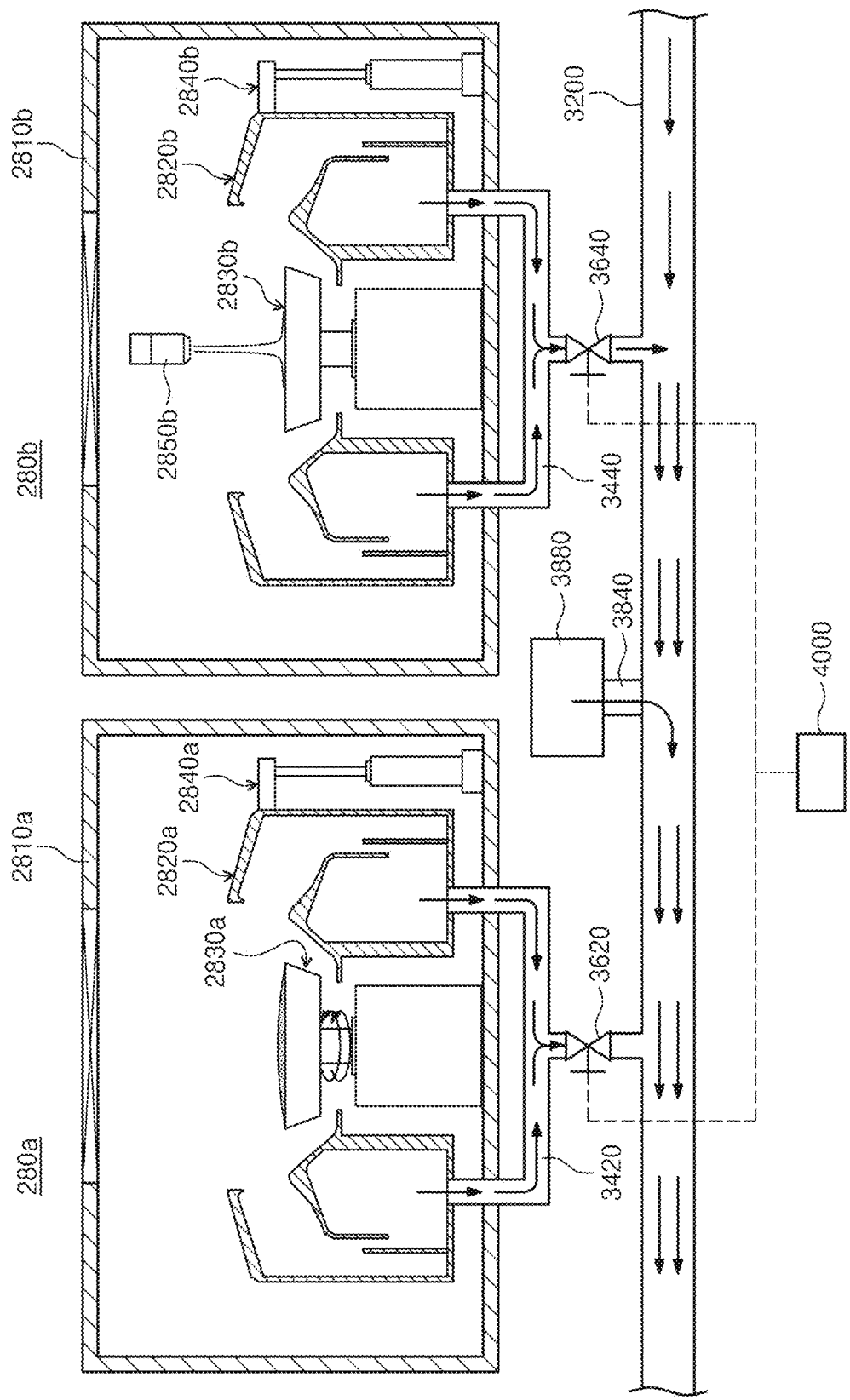

FIGS. 23 to 25 are diagrams schematically illustrating a flow of an air flow in an integrated exhaust line depending on the developing process in FIG. 21. Hereinafter, the flow of the air flow in the integrated exhaust line 8300 depending on the developing process will be described in detail.

Referring to FIG. 23, the developing liquid supplying step is conducted in the first process chamber 280a. The first liquid supply unit 2850a discharges the developing liquid to the substrate W which is seated on the first support unit 2830a of the second process chamber 280a and rotated. The controller 4000 opens the first valve 3620. The internal atmosphere of the first process chamber 280a is exhausted by the first exhaust line 3420 connected to the integrated exhaust line 3200.

Referring to FIG. 24, the puddle step is conducted in the first process chamber 280a. The first liquid supply unit 2850a stops the supply of the developing liquid onto the substrate W. The first support unit 2830a may provide the substrate W to be rotated at the low speed or the substrate W to be stopped. The controller 4000 may control the first valve 3620 so that an opening rate of the first exhaust line 3420 is smaller than that in the developing liquid supplying step and/or the high-speed rotation step. Optionally, the controller 4000 may control to close the first valve 3620 so as to prevent the first exhaust line 3420 from being opened. As a result, the inside of the first process chamber 280a may not be exhausted or a small amount may be exhausted.

In the second process chamber 280b, the substrate loading step is conducted. The transfer robot 224 may transfer the substrate W on the second support unit 2830b. The transfer robot 224 may move the substrate W in the lower direction. The controller 4000 opens the second valve 3640 to exhaust the internal atmosphere of the second process chamber 280b. As a result, the air flow discharged from the second process chamber 280b is introduced into the integrated exhaust line 3200.

Some of the air flow exhausted from the inside of the integrated exhaust line 3200 is introduced into the interference alleviation unit 3840 positioned between the first process chamber 280a and the second process chamber 280b. The air flow introduced into the inference alleviation line 3840 stays in the buffer space provided in the buffer member 3880. The interference alleviation unit 3800 is arranged between the first process chamber 280a in which the puddle step is being conducted and the second process chamber 280b in which the substrate loading step is being conducted to make some of the air flow inside the integrated exhaust line 3200 stay in the buffer member 3880.

As a result, the entirety of the air flow inside the integrated exhaust line 3200 reaching the first process chamber 280a may be minimized. The internal pressure of the first process chamber 280a may be maintained. As a result, shaking of the developing liquid which is maintained on the substrate W in the first process chamber may be minimized. The buffer member 3800 is provided to prevent an air flow including various particles, fumes, etc., generated from the inside of the second process chamber 280b from being leaked to the outside of the integrated exhaust line 3200.

Referring to FIG. 16, the high-speed rotation step is conducted in the first process chamber 280a. The first support unit 2830a rotates at a higher speed than that in the developing liquid supplying step or/and the puddle step. The controller 4000 opens the first valve 3620. The internal atmosphere of the first process chamber 280a is exhausted by the first exhaust line 3420 connected to the integrated exhaust line 3200.

In the second process chamber 280b, the developing liquid supplying step is conducted. The second liquid supply unit 2850b discharges the developing liquid to the substrate W which is seated on the second support unit 2830b of the second process chamber 280b and rotated. The controller 4000 opens the second valve 3640. The internal atmosphere of the second process chamber 280b is exhausted by the second exhaust line 3440 connected to the integrated exhaust line 3200.

When the substrate loading step which is a previous step of the developing liquid supplying step is conducted in the second process chamber 280b, some of the air flow which stays in the buffer member 3880 is discharged to the integrated exhaust line 3200 again. As a result, various particles and fumes included in the air flow which stays in the buffer space are discharged to the integrated exhaust line 3200 jointly with the air flow.

In the exemplary embodiment described in FIGS. 11 to 25, it is described that the process chamber 280 includes the first process chamber 280a and the second process chamber 280b, but is not limited thereto, and a plurality of (a natural number of 3 or more) process chambers 280 may be provided.

Hereinafter, a method for treating a substrate according to an exemplary embodiment of the present invention will be described in detail. In order to perform the substrate treating method described below, the substrate treating apparatus may be controlled by the controller 4000. For example, the controller 4000 may control the first valve 3620, the second valve 3640, and the door 3860 in order to perform the substrate treating method described below. Further, the substrate treating method described below will be described by taking the exemplary embodiment of FIG. 11 as an example. However, the substrate treating method is not limited thereto, and the substrate treating method described below may be performed in various exemplary embodiments of the substrate treating apparatus.

Figure 26:
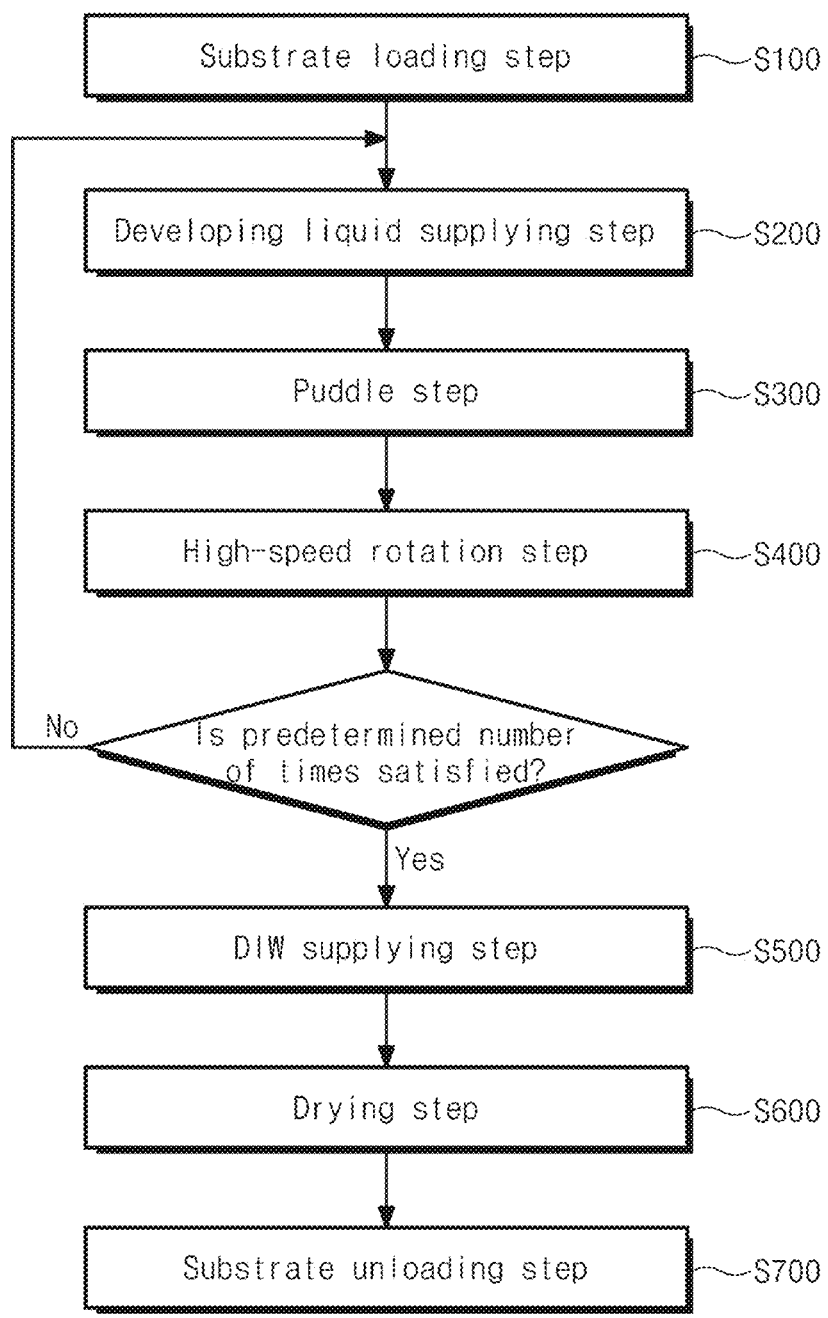
FIG. 26 is a flowchart showing a method for treating a substrate according to an exemplary embodiment of the present invention.

FIG. 26 is a flowchart showing a method for treating a substrate according to an exemplary embodiment of the present invention.

The developing process may sequentially perform a substrate loading step (S100), a developing liquid supplying step (S200), a puddle step (S300), a high-speed rotation step (S400), and a substrate unloading step (S700). The developing liquid supplying step (S200), the puddle step (S300), and the high-speed rotation step (S400) may be conducted at a plurality of times. The developing liquid supplying step (S200), the puddle step (S300), and the high-speed rotation step (S400) may be conducted at a plurality of times until a predetermined number of times is satisfied. The substrate treating method may further include a step (S500) of supplying deionized-water (DIW) onto the substrate and a drying step (S600) after the high-speed rotation step (S400).

In the substrate loading step (S100), the substrate W is carried into the process chamber 280. The substrate W may be seated on a body 2832 of the support unit 2830 of the process chamber 280 by the transfer robot 224. The substrate W moves in the upper direction by the transfer robot 224. In the substrate loading step (S100), the internal atmosphere of the process chamber 280 may be exhausted.

In the developing liquid supplying step (S200), the developing liquid is supplied onto the substrate W installed in the support unit 2830. In the developing liquid supplying step (S200), the substrate W rotates at a first speed. In the developing liquid supplying step (S200), the internal atmosphere of the process chamber 280 may be exhausted.

In the puddle step (S300), the supply of the developing liquid onto the substrate W is stopped and the developing liquid supplied onto the substrate W is maintained. In the puddle step (S300), the substrate W rotates at a second speed slower than the first speed. Optionally, in the puddle step (S300), the substrate W may be stopped. In the puddle step (S300), the internal atmosphere of the process chamber 280 may not be exhausted by closing the exhaust valve 3600. Optionally, the internal atmosphere of the process chamber 280 may be exhausted so that the exhaust may be conducted at an amount smaller than the exhaust amount in the developing liquid supplying step (S200).

The high-speed rotation step of is a step of removing the developing liquid maintained on the substrate W from the puddle step. In the high-speed rotation step (S400), the substrate W rotates at a third speed faster than the first speed. The developing liquid maintained on the substrate is removed by a centrifugal force.

In the step (S500) of supplying the deionized-water (DIW), the DIW may be supplied onto the rotating substrate. In the drying step (S600), the substrate is rotated to remove the liquid which remains in the substrate. Optionally, in the drying step (S600), isopropyl alcohol (IPA) may be supplied onto the substrate. In the substrate unloading step (S500), the substrate W is carried out from the process chamber 280. The substrate W may be carried out from the process chamber 280 by the transfer robot 224. In the substrate unloading step (S500), the internal atmosphere of the process chamber 280 may be exhausted.

The puddle step (S300) is conducted in the first process chamber 280a and the substrate loading step (S100) is conducted in the second process chamber 280b. The first valve 3420 of the first process chamber 280a is closed or the opening rate of the first valve is adjusted to be smaller than that of the second valve 3440. The second valve 3440 of the second process chamber 280b is opened or the opening rate of the second valve 3440 is adjusted to be smaller than that of the first valve 3420. The door 3860 of the path positioned between the first process chamber 280a and the second process chamber 280b is opened. Some of the air flow exhausted from the inside of the integrated exhaust line 3200 is discharged to the outside of the integrated exhaust line 3200 through the door 3860.

Since the developing liquid is maintained in the first process chamber 280a, the internal pressure of the first process chamber 280a should be maintained. While the substrate W moves in the lower direction in the second process chamber 280b, the air layer descends inside the second process chamber 280b. The internal atmosphere of the second process chamber 280b and the descending pressure of the air layer generated during the substrate loading process are jointly discharged to the integrated exhaust line 3200. More amount is discharged in the substrate loading step (S100), which is larger than a general exhaust amount discharged to the inside of the integrated exhaust line 3200 after the substrate loading step (S100). A large amount of exhaust air flow formed inside the second process chamber 280b is distributed by opening the door 3860 positioned between the first process chamber 280a and the second process chamber 280b to alleviate the exhaust interference in the first process chamber 280a in which the puddle step (S300) is being conducted.

Referring back to FIGS. 3 to 5, the interface module 50 connects the treating module 20 and an external exposure apparatus 60. The interface module 50 includes an interface frame 520, an additional process chamber 540, an interface buffer 560, and a transfer member 580.

The interface frame 520 provides the internal space. A fan filter unit forming the descending air flow in the internal space may be provided at the upper end of the interface frame 520. The additional process chamber 540, the interface buffer 560, and the transfer member 580 are provided in the internal space of the interface frame 520.

The additional process chamber 540 may perform a predetermined additional process before the substrate W of which process is completed in the coating block 20a is carried in the exposure apparatus 60. Optionally, the additional process chamber 540 may perform a predetermined additional process before the substrate W of which process is completed in the exposure apparatus 60 is carried in the developing block 20b. According to an example, the additional process may be an edge exposure process of exposing the edge region of the substrate W, a top surface cleaning process of cleaning the top surface of the substrate W, or a bottom surface cleaning process of cleaning the bottom surface of the substrate W. A plurality of additional process chambers 540 may be provided and provided to be laminated on each other. All of the additional process chambers 540 may be provided to perform the same process. Optionally, some of the additional process chambers 540 may be provided to perform different processes.

The interface buffer 560 provides a space in which the substrate W transferred among the coating block 20a, the additional process chamber 540, the exposure apparatus 60, and the developing block 20b temporarily stays in the middle of the transfer. A plurality of interface buffers 560 may be provided and the plurality of interface buffers 560 may be provided to be laminated on each other. According to an example, the additional process chamber 540 may be arranged on one side surface based on an extension line of the longitudinal direction of the transfer chamber 220, and the interface buffer 560 may be arranged on the other side surface.

The transfer member 580 transfers the substrate W among the coating block 20a, the additional process chamber 540, the exposure apparatus 60, and the developing block 20b. The transfer member 580 may be provided as one or a plurality of robots. According to an example, the transfer member 580 includes a first robot 5820, a second robot 5840, and a third robot 5860. The first robot 5820 transfers the substrate W among the coating block 20a, the additional process chamber 540, and the interface buffer 560. The second robot 5840 transfers the substrate W between the interface buffer 560 and the exposure apparatus 60. The third robot 5860 transfers the substrate W between the interface buffer 560 and the developing block 20*b*.

Each of the first robot 5820, the second robot 5840, and the third robot 5860 includes a hand in which the substrate W is placed. The hand may be provided to be movable forward and backward, rotatable with the third direction 6 as the axis and movable in the third direction 6. All of the hands of the first robot 5820, the second robot 5840, and the third robot 5860 may be provided in the same or similar shape as the transfer hand 2240 of the transfer robot 224. Optionally, the hand of the robot which directly sends and receives the substrate W to and form the cooling plate 2642 of the heat treating chamber may be provided in the same or similar shape as the transfer hand 2240 of the transfer robot 224, and the hand of the remaining robot may be provided in a different shape therefrom.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate, the apparatus comprising:
   a first process chamber having a first treating space therein;
   a second process chamber having a second treating space therein; and
   an exhaust unit configured to exhaust atmospheres of the first treating space and the second treating space,
   wherein the exhaust unit includes
   an integrated exhaust line in which a pressure reduction unit is installed, a first exhaust line configured to connect the first process chamber and a first point of the integrated exhaust line,
   a second exhaust line configured to connect the second process chamber and a second point of the integrated exhaust line, and
   an interference alleviation unit configured to alleviate exhaust interference between the first process chamber and the second process chamber by allowing airflow to outside through an opening in the integrated exhaust line,
   wherein the interference alleviation unit includes a discharge unit positioned between the first point to which the first exhaust line is connected and the second point to which the second exhaust line is connected in the integrated exhaust line.

2. The apparatus of claim 1, wherein the discharge unit includes
   an interference alleviation line of which one end is connected to the integrated exhaust line, and
   a buffer member connected to the interference alleviation line and configured to provide a buffer space in which the airflow discharged from the integrated exhaust line through the interference alleviation line stays.

3. The apparatus of claim 1, wherein the interference alleviation unit includes a slideable door.

4. The apparatus of claim 3, wherein the door is positioned between the first process chamber and the second process chamber.

5. An apparatus for treating a substrate, the apparatus comprising:
   a first process chamber having a first treating space therein;
   a second process chamber having a second treating space therein; and
   an exhaust unit configured to exhaust atmospheres of the first treating space and the second treating space,
   wherein the exhaust unit includes
   an integrated exhaust line in which a pressure reduction unit is installed,
   a first exhaust line configured to connect the first process chamber and a first point of the integrated exhaust line,
   a second exhaust line configured to connect the second process chamber and a second point of the integrated exhaust line, and
   an interference alleviation unit configured to alleviate exhaust interference between the first process chamber and the second process chamber, wherein the interference alleviation unit includes a discharge unit between the first point to which the first exhaust line is connected and the second point to which the second exhaust line is connected in the integrated exhaust line and configured to discharge some of air flow in the integrated exhaust line to outside of the integrated exhaust line, and wherein the discharge unit includes
   a first discharge unit adjacent to the first point of the first exhaust line, and
   a second discharge unit adjacent to the second point of the second exhaust line.

6. The apparatus of claim 5, wherein
   each of the first process chamber and the second process chamber is configured to perform a developing process for the substrate,
   the developing process includes a substrate loading operation of carrying the substrate into the first process chamber or the second process chamber, a developing liquid supplying operation of supplying a developing liquid onto the substrate while rotating the substrate at a first speed, a puddle operation of stopping the supply of the developing liquid onto the substrate and stopping the substrate for a first time or rotating the substrate at a second speed lower than the first speed, and a substrate unloading operation of carrying the substrate out from the first process chamber or the second process chamber, and
   the apparatus further includes a controller configured to control a door so as to open a path at least partly during the puddle operation for the substrate in the first process chamber.

7. The apparatus of claim 6, wherein the discharge unit is provided to discharge some of the airflow in the integrated exhaust line to an atmosphere.

8. The apparatus of claim 7, wherein the discharge unit further includes a door configured to open or close a path through which the airflow is discharged from the integrated exhaust line to the atmosphere.

9. The apparatus of claim 8, wherein
each of the first process chamber and the second process chamber is configured to perform a developing process for the substrate,
the developing process includes a substrate loading operation of carrying the substrate into the first process chamber or the second process chamber, a developing liquid supplying operation of supplying a developing liquid onto the substrate while rotating the substrate at a first speed, a puddle operation of stopping the supply of the developing liquid onto the substrate and stopping the substrate for a first time or rotating the substrate at a second speed lower than the first speed, and a substrate unloading operation of carrying the substrate out from the first process chamber or the second process chamber, and
the apparatus further includes a controller configured to control the door so as to open the path at least partly during the puddle operation for the substrate in the first process chamber.

10. The apparatus of claim 9, wherein
the substrate loading operation includes a process of moving the substrate in a lower direction, and
the controller is configured to control the door to open the path at least partly during the substrate loading operation in the second process chamber.

11. The apparatus of claim 9, wherein
the exhaust unit further includes a first valve configured to open or close the first exhaust line or to adjust an exhaust flow rate, and
a second valve configured to open or close the second exhaust line or to adjust the exhaust flow rate, and
the controller is configured to control the first valve so that an opening rate of the first valve at least partly during the puddle operation for the substrate in the first process chamber is smaller than the opening rate of the first valve at least partly during the developing liquid supplying operation.

12. The apparatus claim 8, wherein each of the first process chamber and the second process chamber is configured to perform a developing process for the substrate,
the developing process includes a substrate loading operation of carrying the substrate into the first process chamber or the second process chamber, a developing liquid supplying operation of supplying a developing liquid onto the substrate while rotating the substrate at a first speed, a puddle operation of stopping the supply of the developing liquid onto the substrate and stopping the substrate for a first time or rotating the substrate at a second speed lower than the first speed, and a substrate unloading operation of carrying the substrate out from the first process chamber or the second process chamber, and
the apparatus further includes a controller configured to control the door so as to open the path at least partly during the puddle operation for the substrate in the first process chamber and the substrate loading operation in the second process chamber.

13. An apparatus for treating a substrate, the apparatus comprising:
a first process chamber having a first treating space;
a second process chamber having a second treating space;
a transfer robot configured to transfer the substrate to the first process chamber or the second process chamber; and
an exhaust unit configured to exhaust atmospheres of the first treating space and the second treating space,
wherein the first process chamber includes
a first treating container configured to provide the first treating space,
a first support unit configured to support and rotate the substrate in the first treating space; and
a first developing liquid supply unit configured to supply a developing liquid onto the substrate,
the second process chamber includes
a second treating container configured to provide the second treating space,
a second support unit configured to support and rotate the substrate in the second treating space, and
a second developing liquid supply unit configured to supply the developing liquid onto the substrate,
the exhaust unit includes
an integrated exhaust line in which a pressure reduction unit is installed,
a first exhaust line connecting the first process chamber and a first point of the integrated exhaust line,
a second exhaust line connecting the second process chamber and a second point of the integrated exhaust line, and
an interference alleviation unit configured to alleviate exhaust interference between the first process chamber and the second process chamber by some of an air flow in the integrated exhaust line to outside of the integrated exhaust line through an opening in the integrated exhaust line, and
the interference alleviation unit is between the first point to which the first exhaust line is connected and the second point to which the second exhaust line is connected in the integrated exhaust line.

14. The apparatus of claim 13, wherein the interference alleviation unit further includes a slideable door for opening/closing a path through which the air flow is discharged from the integrated exhaust line to an atmosphere.

15. The apparatus of claim 14, wherein
each of the first process chamber and the second process chamber is configured to perform a developing process for the substrate,
the developing process includes a substrate loading operation of carrying the substrate into the first process chamber or the second process chamber, a developing liquid supplying operation of supplying a developing liquid onto the substrate while rotating the substrate at a first speed, a puddle operation of stopping the supply of the developing liquid onto the substrate and stopping the substrate for a firsttime or rotating the substrate at a second speed lower than the first speed, and a substrate unloading operation of carrying the substrate out from the first process chamber or the second process chamber, and
the substrate loading operation includes a process of moving the substrate in a lower direction, and
the apparatus further includes a controller configured to control the door so as to open the path at least partly during the puddle operation in the first process chamber and at least partly during the substrate loading operation in the second process chamber.

16. The apparatus of claim 13, wherein the interference alleviation unit includes
an interference alleviation line of which one end is connected to the integrated exhaust line, and
a buffer member connected to the interference alleviation line and providing a buffer space in which the air flow discharged from the integrated exhaust line through the interference alleviation line stays.

* * * * *